US011272131B2

(12) United States Patent
Murata

(10) Patent No.: US 11,272,131 B2
(45) Date of Patent: Mar. 8, 2022

(54) BACKSIDE ILLUMINATION IMAGE SENSOR, MANUFACTURING METHOD THEREOF AND IMAGE-CAPTURING DEVICE

(71) Applicant: NIKON CORPORATION, Tokyo (JP)

(72) Inventor: Hironobu Murata, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/150,284

(22) Filed: Jan. 15, 2021

(65) Prior Publication Data

US 2021/0144329 A1 May 13, 2021

Related U.S. Application Data

(63) Continuation of application No. 16/249,409, filed on Jan. 16, 2019, now Pat. No. 10,924,699, which is a (Continued)

(30) Foreign Application Priority Data

Feb. 17, 2009 (JP) ............................. JP2009-034106
Feb. 17, 2009 (JP) ............................. JP2009-034107

(51) Int. Cl.
*H04N 5/374* (2011.01)
*H04N 5/232* (2006.01)
(Continued)

(52) U.S. Cl.
CPC ......... *H04N 5/3745* (2013.01); *G02B 3/0056* (2013.01); *G02B 5/201* (2013.01);
(Continued)

(58) Field of Classification Search
CPC .... H04N 5/376; G09G 3/3611; G09G 3/3208; G09G 2310/0221; G09G 2310/0286
See application file for complete search history.

(56) References Cited

U.S. PATENT DOCUMENTS 7,873,267 B2 * 1/2011 Kusaka ................. G03B 13/36
396/104
7,928,352 B2 4/2011 Toda
(Continued)

FOREIGN PATENT DOCUMENTS

JP   S62-258404 A   11/1987
JP   2000-156823 A   6/2000
(Continued)

OTHER PUBLICATIONS

Apr. 6, 2021 Office Action issued in Japanese Patent Application No. 2020-145905.
(Continued)

*Primary Examiner* — Hung H Lam
(74) *Attorney, Agent, or Firm* — Oliff PLC

(57) ABSTRACT

An image sensor includes a first photoelectric conversion unit that converts light incident through a first opening to an electric charge, a second photoelectric conversion unit that converts light incident through a second opening which is smaller than the first opening to an electric charge, and a signal output wiring that outputs a first signal generated by the electric charge converted by the first photoelectric conversion unit and a second signal generated by the electric charge converted by the second photoelectric conversion unit. The second photoelectric conversion unit is disposed between the second opening and the signal output wiring.

15 Claims, 25 Drawing Sheets

Related U.S. Application Data continuation of application No. 15/861,917, filed on Jan. 4, 2018, now Pat. No. 10,382,713, which is a continuation of application No. 15/439,103, filed on Feb. 22, 2017, now Pat. No. 9,894,305, which is a continuation of application No. 14/989,205, filed on Jan. 6, 2016, now Pat. No. 9,609,248, which is a continuation of application No. 14/690,886, filed on Apr. 20, 2015, now Pat. No. 9,258,500, which is a continuation of application No. 14/135,144, filed on Dec. 19, 2013, now Pat. No. 9,036,074, which is a continuation of application No. 12/702,456, filed on Feb. 9, 2010, now Pat. No. 8,638,381.

(51) Int. Cl.
| | | |
|---|---|---|
| H04N 5/3745 | (2011.01) | |
| G02B 3/00 | (2006.01) | |
| G02B 5/20 | (2006.01) | |
| H01L 27/146 | (2006.01) | |
| H04N 9/04 | (2006.01) | |
| H04N 5/369 | (2011.01) | |

(52) U.S. Cl.
CPC .... *H01L 27/1464* (2013.01); *H01L 27/14621* (2013.01); *H01L 27/14623* (2013.01); *H01L 27/14627* (2013.01); *H01L 27/14636* (2013.01); *H04N 5/23212* (2013.01); *H04N 5/3696* (2013.01); *H04N 5/3741* (2013.01); *H04N 9/04557* (2018.08)

(56) References Cited

U.S. PATENT DOCUMENTS

| | | | |
|---|---|---|---|
| 8,379,121 | B2 | 2/2013 | Murata |
| 8,638,381 | B2 | 1/2014 | Murata |
| 9,036,074 | B2 | 5/2015 | Murata |
| 9,258,500 | B2 | 2/2016 | Murata |
| 9,883,127 | B2* | 1/2018 | Hoda .................. H04N 5/367 |
| 2003/0025160 | A1 | 2/2003 | Suzuki et al. |
| 2004/0141077 | A1 | 7/2004 | Ohkawa |
| 2004/0262651 | A1 | 12/2004 | Mouli |
| 2006/0076590 | A1 | 4/2006 | Pain et al. |
| 2007/0091190 | A1 | 4/2007 | Iwabuchi et al. |
| 2007/0154200 | A1 | 7/2007 | Utagawa et al. |
| 2008/0084483 | A1 | 4/2008 | Kusaka |
| 2008/0087800 | A1 | 4/2008 | Toda |
| 2008/0194076 | A1* | 8/2008 | Chang ............. B81C 1/0038 438/455 |
| 2008/0203452 | A1 | 8/2008 | Moon et al. |
| 2008/0217724 | A1 | 9/2008 | Uya |
| 2008/0291311 | A1 | 11/2008 | Kusaka |
| 2008/0308890 | A1 | 12/2008 | Uya |
| 2010/0291730 | A1 | 11/2010 | Uya et al. |
| 2010/0295978 | A1 | 11/2010 | Nakamura et al. |
| 2010/0308427 | A1* | 12/2010 | Lenchenkov ..... H01L 27/14625 257/432 |
| 2011/0102653 | A1 | 5/2011 | Shintani et al. |
| 2011/0193940 | A1 | 8/2011 | Park et al. |
| 2011/0227138 | A1 | 9/2011 | Haddad et al. |
| 2013/0215304 | A1 | 8/2013 | Yamashita et al. |
| 2013/0235237 | A1 | 9/2013 | Aoki |
| 2014/0132812 | A1 | 5/2014 | Soda |
| 2014/0203171 | A1 | 7/2014 | Itahashi |
| 2014/0253756 | A1 | 9/2014 | Yokogawa |
| 2016/0126273 | A1 | 5/2016 | Suzuki et al. |
| 2017/0104912 | A1 | 4/2017 | Ichikawa et al. |

FOREIGN PATENT DOCUMENTS

| | | |
|---|---|---|
| JP | 2000-305010 A | 11/2000 |
| JP | 2002-151676 A | 5/2002 |
| JP | 2002-231930 A | 8/2002 |
| JP | 2003-031785 A | 1/2003 |
| JP | 2003-244712 A | 8/2003 |
| JP | 2004-095966 A | 3/2004 |
| JP | 2005-347708 A | 12/2005 |
| JP | 2005-347709 A | 12/2005 |
| JP | 2006-019360 A | 1/2006 |
| JP | 2006-019653 A | 1/2006 |
| JP | 2006-049338 A | 2/2006 |
| JP | 2006-270292 A | 10/2006 |
| JP | 2006-303752 A | 11/2006 |
| JP | 2007-115994 A | 5/2007 |
| JP | 2007-155929 A | 6/2007 |
| JP | 2007-155930 A | 6/2007 |
| JP | 2007-282109 A | 10/2007 |
| JP | 2008-15215 A | 1/2008 |
| JP | 2008-103668 A | 5/2008 |
| JP | 2008-263352 A | 10/2008 |
| JP | 2008-311413 A | 12/2008 |
| JP | 2009-014460 A | 1/2009 |
| JP | 2009-014461 A | 1/2009 |
| JP | 2009-017152 A | 1/2009 |
| JP | 2009-232288 A | 10/2009 |
| JP | 2010-066494 A | 3/2010 |
| JP | 2010-193073 A | 9/2010 |
| WO | 2010/050184 A1 | 5/2010 |

OTHER PUBLICATIONS

May 14, 2013 Office Action issued in Japanese Application No. 2009-034107.
Feb. 25, 2014 Office Action issued in Japanese Application No. 2013-062725.
Aug. 5, 2014 Office Action issued in Japanese Application No. 2013-242170.
Nov. 21, 2014 Office Action issued in U.S. Appl. No. 14/135,144.
Jan. 20, 2015 Notice of Allowance issued in U.S. Appl. No. 14/135,144.
Sep. 24, 2015 Notice of Allowance issued in U.S. Appl. No. 14/690,886.
Jan. 22, 2013 Office Action issued in Japanese Application No. 2011-062887.
Feb. 3, 2016 Office Action issued in Korean Application No. 2010-0011458.
Jun. 17, 2016 Office Action issued in U.S. Appl. No. 14/989,205.
Jun. 7, 2016 Office Action issued in Japanese Application No. 2014-251265.
Jun. 7, 2016 Office Action issued in Japanese Application No. 2015-098094.
Sep. 6, 2016 Office Action issued in Japanese Application No. 2015-098094.
Nov. 17, 2016 Notice of Allowance issued in U.S. Appl. No. 14/989,205.
Oct. 6, 2015 Office Action issued in Japanese Application No. 2014-251265.
Aug. 31, 2012 Office Action issued in U.S. Appl. No. 12/702,456.
Jan. 7, 2013 Notice of Allowance issued in U.S. Appl. No. 12/702,456.
Sep. 17, 2013 Notice of Allowance issued in U.S. Appl. No. 12/702,456.
Apr. 20, 2017 Office Action Issued in U.S. Appl. No. 15/439,103.
Dec. 12, 2017 Office Action issued in Japanese Application No. 2017-022352.
Oct. 4, 2017 Notice of Allowance issued in U.S. Appl. No. 15/439,103.
May 14, 2019 Office Action issued in Japanese Patent Application No. 2018-101539.
Oct. 15, 2020 Notice of Allowance issued in U.S. Appl. No. 16/249,409.
Nov. 17, 2020 Office Action issued in Japanese Patent Application No. 2020-145905.
Mar. 27, 2020 Office Action issued in U.S. Appl. No. 16/249,409.

* cited by examiner

BACKSIDE ILLUMINATION IMAGE SENSOR, MANUFACTURING METHOD THEREOF AND IMAGE-CAPTURING DEVICE

INCORPORATION BY REFERENCE

This is a continuation of U.S. patent application Ser. No. 16/249,409 filed Jan. 16, 2019, which is a continuation of U.S. patent application Ser. No. 15/861,917 filed Jan. 4, 2018, which is a continuation of U.S. patent application Ser. No. 15/439,103 filed Feb. 22, 2017, which in turn is a continuation of U.S. patent application Ser. No. 14/989,205 filed Jan. 6, 2016 (now U.S. Pat. No. 9,609,248), which in turn is a continuation of U.S. patent application Ser. No. 14/690,886 filed Apr. 20, 2015 (now U.S. Pat. No. 9,258,500), which in turn is a continuation of U.S. patent application Ser. No. 14/135,144 filed Dec. 19, 2013 (now U.S. Pat. No. 9,036,074), which is a continuation of U.S. patent application Ser. No. 12/702,456 filed Feb. 9, 2010 (now U.S. Pat. No. 8,638,381). The disclosure of each of the prior U.S. applications is incorporated herein by reference in its entirety. The disclosures of the following priority applications are herein incorporated by reference in their entireties: Japanese Patent Application No. 2009-034106 filed Feb. 17, 2009; and Japanese Patent Application No. 2009-034107 filed Feb. 17, 2009.

BACKGROUND OF THE INVENTION

1. Field of the Invention

The present invention relates to a backside illumination image sensor, a manufacturing method thereof and an image-capturing device equipped with the image sensor.

2. Description of Related Art

The image sensors known in the related art include front-side illumination image sensors that have both focus detection pixels and image-capturing pixels (see, for instance, Japanese Laid Open Patent Publication No. 2000-305010).

SUMMARY OF THE INVENTION

Since the front-side illumination image sensor in the related art, such as that disclosed in Japanese Laid Open Patent Publication No. 2000-305010 necessitates that a wiring through which a signal from a photoelectric conversion unit is read out, a color filter and a light shielding layer be formed between a micro lens and a light receiving unit, the distance (depth) from the micro lens to the light receiving unit, measured at the front-side illumination image sensor is bound to be large. This gives rise a problem that as the pixels at the image sensor are further miniaturized, the focus detection accuracy is likely to be adversely affected.

In addition, at the front-side illumination image sensor in the related art disclosed in Japanese Laid Open Patent Publication No. 2000-305010, the wiring through which the signal from the photoelectric conversion unit is read out must be formed on the light entry side of the light receiving unit, which necessitates that the light receiving opening be formed at a position set apart from the wiring and for this reason, the opening through which light enters the light receiving unit tends to be narrow. This leads to another problem in that it becomes increasingly difficult to install focus detection pixels at an image sensor with miniaturized pixels, which adopts a structure that includes focus detection pixels with even smaller light receiving openings (a pair of such light receiving openings equivalent in size to the light-receiving opening at a standard image-capturing pixel) compared to the light receiving openings at image-capturing pixels.

According to the 1st aspect of the present invention, a backside illumination image sensor equipped with a plurality of pixels disposed in a two-dimensional pattern, comprises: image-capturing pixels; and focus detection pixels.

According to the 2nd aspect of the present invention, in the backside illumination image sensor according to the 1st aspect, it is preferred that: the image-capturing pixels and the focus detection pixels each include a semiconductor layer with a photoelectric conversion unit formed at one surface thereof and another surface thereof used as a light receiving surface, and a wiring layer with a wiring via which a signal from the photoelectric conversion unit is read out; the wiring layer at the image-capturing pixels and the wiring layer at the focus detection pixels are each formed on a side where the one surface of the semiconductor layer is present; the image-capturing pixels each include a color filter, through which light in a predetermined wavelength range is transmitted, formed on a side where the other surface of the semiconductor layer is present; and the focus detection pixels each include a light shielding film that blocks part of light to enter the other surface of the semiconductor layer, formed at a layer corresponding to the color filter at each of the image-capturing pixels.

According to the 3rd aspect of the present invention, in the backside illumination image sensor according to the 2nd aspect, it is preferred that the light shielding film assumes a thickness different from a thickness of the color filter.

According to the 4th aspect of the present invention, in the backside illumination image sensor according to the 2nd aspect, it is preferred that the light shielding film assumes a position offset from a position of the color filter along a thickness of the backside illumination image sensor.

According to the 5th aspect of the present invention, in the backside illumination image sensor according to the 2nd aspect, it is preferred that the focus detection pixels each further includes a wiring via which a signal from a photoelectric conversion unit at another pixel is read out instead of the signal from the photoelectric conversion unit at the each of the focus detection pixels, formed on the side where the one surface of the semiconductor layer is present.

According to the 6th aspect of the present invention, in the backside illumination image sensor according to the 2nd aspect, it is preferred that the wiring overlaps a projected image of a light receiving area of the photoelectric conversion unit, projected from a side where the light receiving surface of the backside illumination image sensor is present.

According to the 7th aspect of the present invention, an image-capturing device comprises a backside illumination image sensor according to the 1st aspect.

According to the 8th aspect of the present invention, a backside illumination image sensor manufacturing method comprises: a P-type epitaxial layer forming step of forming a P-type epitaxial layer at a surface of a substrate; a photoelectric conversion unit forming step of forming photoelectric conversion units at a surface of the P-type epitaxial layer; a wiring layer forming step of forming a wiring layer over the photoelectric conversion units; a substrate removing step of removing the substrate from the P-type epitaxial layer; a light shielding film-color filter forming step of forming light shielding films and color filters over a surface of the P-type epitaxial layer from which the substrate has been removed; and a micro lens forming step of forming micro-lenses over the light shielding films and the color filters.

According to the 9th aspect of the present invention, in the backside illumination image sensor according to the 1st aspect, it is preferred that: the focus detection pixels each include a semiconductor layer with a photoelectric conversion unit formed at one surface thereof and another surface thereof used as a light receiving surface, a light shielding film that blocks part of light to enter the other surface and a wiring via which a signal from the photoelectric conversion unit is read out; the wiring is formed on a side where the one surface of the semiconductor layer is present; and the light shielding film is formed on a side where the other surface of the semiconductor layer is present.

According to the 10th aspect of the present invention, in the backside illumination image sensor according to the 9th aspect, it is preferred that the focus detection pixels each further includes a wiring via which a signal from a photoelectric conversion unit at another pixel is read out instead of the signal from the photoelectric conversion unit at the each of the focus detection pixels, formed on the side where the one surface of the semiconductor layer is present.

According to the 11th aspect of the present invention, in the backside illumination image sensor according to the 9th aspect, it is preferred that the wiring overlaps a projected image of a light receiving area of the photoelectric conversion unit, projected from a side where the light receiving surface of the backside illumination image sensor is present.

According to the 12th aspect of the present invention, in the backside illumination image sensor according to the 9th aspect, it is preferred that a voltage is applied to the light shielding film.

According to the 13th aspect of the present invention, in the backside illumination image sensor according to the 9th aspect, it is preferred that the light shielding film is constituted of a metal assuming a reflectance equal to or less than a predetermined level lower than a reflectance of aluminum.

According to the 14th aspect of the present invention, in the backside illumination image sensor according to the 9th aspect, it is preferred that the light shielding film is constituted of an oxide or a nitride that assumes a reflectance equal to or less than a predetermined level lower than a reflectance of aluminum and does not allow light to be transmitted through.

According to the 15th aspect of the present invention, in the backside illumination image sensor according to the 9th or the 10th aspect, it is preferred that the light shielding film is constituted of a resin that assumes a reflectance equal to or less than a predetermined level and does not allow light to be transmitted through.

According to the 16th aspect of the present invention, in the backside illumination image sensor according to the 9th aspect, it is preferred that a film, which is constituted of a metal assuming a reflectance equal to or less than a predetermined level lower than a reflectance of aluminum, is formed over a surface of the light shielding film.

According to the 17th aspect of the present invention, in the backside illumination image sensor according to the 9th aspect, it is preferred that a film, which is constituted of an oxide or a nitride assuming a reflectance equal to or less than a predetermined level lower than a reflectance of aluminum and does not allow light to be transmitted through, is formed over a surface of the light shielding film.

According to the 18th aspect of the present invention, in the backside illumination image sensor according to the 9th aspect, it is preferred that a film, which is constituted of a resin assuming a reflectance equal to or less than a predetermined level lower than a reflectance of aluminum and does not allow light to be transmitted through, is formed over a surface of the light shielding film.

According to the 19th aspect of the present invention, in the backside illumination image sensor according to the 13th aspect, it is preferred that the predetermined level matches a reflectance of tin.

According to the 20th aspect of the present invention, in the backside illumination image sensor according to the 1st aspect, it is preferred that: the focus attention pixels each include a semiconductor layer with a photoelectric conversion unit and a transistor formed at one surface thereof and another surface thereof used as a light receiving surface, a light shielding film that blocks part of light to enter the other surface, and at least one wiring among a signal line via which a signal from the photoelectric conversion unit is read out, a source line via which power to be used to amplify the signal from the photoelectric conversion unit is supplied and a control line via which the transistor is controlled; the wiring is formed on a side where the one surface of the semiconductor layer is present; and the light shielding film is formed on a side where the other surface of the semiconductor layer is present and assumes at least one function among a function of reading out the signal from the photoelectric conversion unit, a function of supplying the power to be used to amplify the signal from the photoelectric conversion unit and a function of controlling the transistor.

According to the 21st aspect of the present invention, an image-capturing device comprises a backside illumination image sensor according to the 9th aspect.

According to the 22nd aspect of the present invention, a backside illumination image sensor manufacturing method comprises: a P-type epitaxial layer forming step of forming a P-type epitaxial layer at a surface of a substrate; a photoelectric conversion unit forming step of forming photoelectric conversion units at a surface of the P-type epitaxial layer; a wiring layer forming step of forming a wiring layer over the photoelectric conversion units; a substrate removing step of removing the substrate from the P-type epitaxial layer; a light shielding film forming step of forming light shielding films over a surface of the P-type epitaxial layer from which the substrate has been removed; a transparent film-color filter forming step of forming transparent films and color filters over the light shielding films; and a micro lens forming step of forming micro lenses over the transparent films and the color filters.

DESCRIPTION OF PREFERRED EMBODIMENTS

First Embodiment

Figure 1:
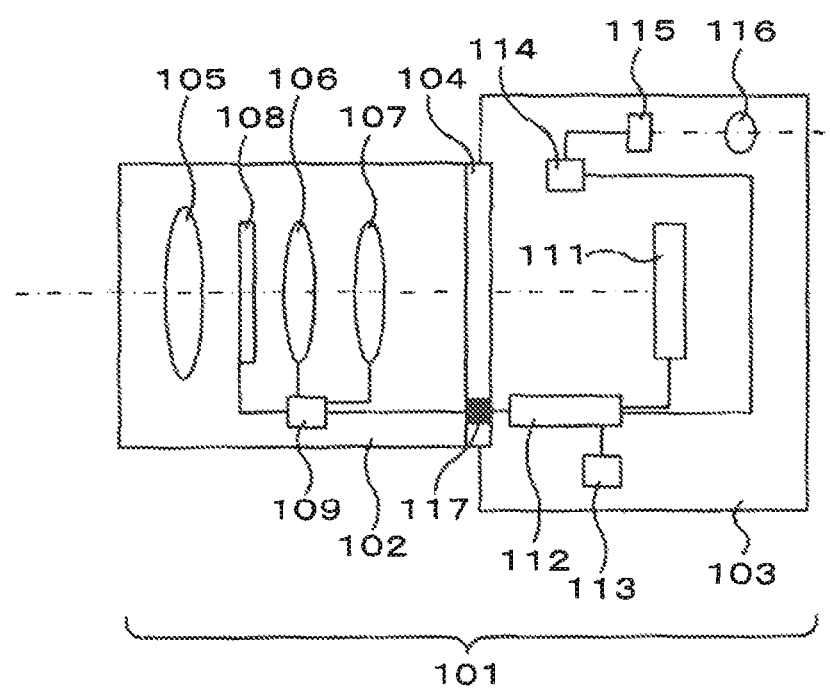
FIG. 1 shows the structure adopted in the electronic camera achieved in a first embodiment.

The first embodiment, achieved by adopting the present invention in an electronic camera to function as an image-capturing device, is now described. FIG. 1 shows the structure adopted in the electronic camera achieved in the first embodiment. The electronic camera 101 in the first embodiment comprises an exchangeable lens 102 and a camera body 103. The exchangeable lens 102 is mounted on a mount unit 104 at the camera body 103.

The exchangeable lens 102 includes lenses 105 through 107, an aperture 108 and a lens drive control device 109. It is to be noted that the lens 106 is a zooming lens and that the lens 107 is a focusing lens. The lens drive control device 109, constituted with a CPU and its peripheral components, controls the drive of the focusing lens 107 and the aperture 108. It also detects the positions of the zooming lens 106, the focusing lens 107 and the aperture 108, and transmits lens information and receives camera information by communicating with a control device in the camera body 103.

An image sensor 111, a camera drive control device 112, a memory card 113, an LCD driver 114, an LCD 115, an eyepiece lens 116 and the like are disposed at the camera body 103. The image sensor 111, set at the predetermined image forming plane (predetermined focal plane) of the exchangeable lens 102, captures a subject image formed through the exchangeable lens 102 and outputs image signals. At the image sensor 111, pixels used for image-capturing (hereafter simply referred to as image-capturing pixels) are disposed in a two-dimensional pattern, and rows of pixels used for focus detection (hereafter simply referred to as focus detection pixels), instead of image-capturing pixels, are disposed in the two-dimensional array over areas corresponding to focus detection positions.

The camera drive control device 112, constituted with a CPU and its peripheral components, controls the drive of the image sensor 111, processes the captured image, executes focus detection and focus adjustment for the exchangeable lens 102, controls the aperture 108, controls the display operation at the LCD 115, communicates with the lens drive control device 109 and controls the overall operational sequence in the camera. It is to be noted that the camera drive control device 112 communicates with the lens drive control device 109 via an electrical contact point 117 at the mount unit 104.

The memory card 113 is an image storage device in which captured images are stored. The LCD 115 is used as a display unit of a liquid crystal viewfinder (EVF: electronic viewfinder). The photographer is able to visually check a captured image displayed at the LCD 115 via the eyepiece lens 116.

The subject image formed on the image sensor 111 after passing through the exchangeable lens 102 undergoes photoelectric conversion at the image sensor 111 and the image output is provided to the camera drive control device 112. The camera drive control device 112 determines through arithmetic operation the defocus quantity indicating the extent of defocusing manifesting at a focus detection position based upon the outputs from the focus detection pixels and transmits the defocus quantity to the lens drive control device 109. In addition, the camera drive control device 112 provides image signals generated based upon the outputs from the image-capturing pixels to the LCD driver 114 so as to display the captured image at the LCD 115, and also stores the image signals into the memory card 113.

The lens drive control device 109 detects the positions of the zooming lens 106, the focusing lens 107 and the aperture 108 and obtains through arithmetic operation the lens information based upon the detected positions. As an alternative, the lens information corresponding to the detected positions may be selected from a lookup table prepared in advance. The lens information is then provided to the camera drive control device 112. In addition, the lens drive control device 109 calculates a lens drive quantity indicating the extent to which the lens is to be driven based upon the defocus quantity received from the camera drive control device 112, and controls the drive of the focusing lens 107 based upon the lens drive quantity.

The image sensor 111 is a backside illumination 4TR-CMOS (complementary metal oxide semiconductor) sensor. The 4TR-CMOS sensor assumes a four-transistor structure which, together with a photoelectric conversion unit, includes a transfer gate transistor, a source follower transistor, a row selector transistor and a reset transistor. A detailed description is to be provided later.

Figure 2:
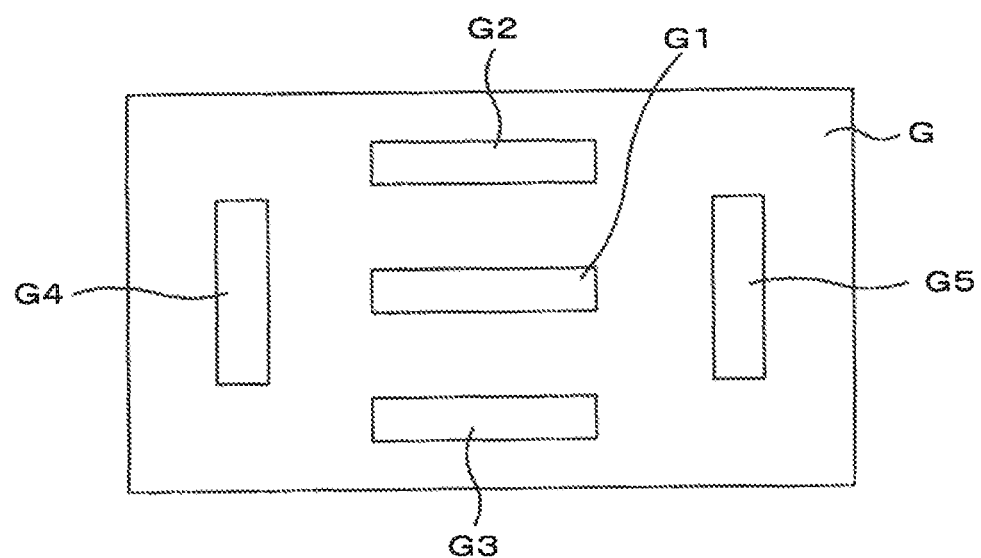
FIG. 2 shows focus detection areas assumed on the image-capturing plane set on the predetermined image forming plane of the exchangeable lens in the first embodiment.

FIG. 2 shows focus detection areas on an image-capturing plane G set on the predetermined image forming plane of the exchangeable lens 102. Focus detection areas G1 through G5 are set on the image-capturing plane G and focus detection pixels are disposed in a linear formation along the longer side of each of the focus detection areas G1 through G5 set on the image-capturing plane G. Namely, focus detection pixel rows on the image sensor 111 sample the image portions in the focus detection areas G1 through G5 within the subject image formed on the photographic image plane G. The photographer manually selects a specific focus detection area among the focus detection areas G1 through G5 in correspondence to the desired photographic composition.

Figure 3:
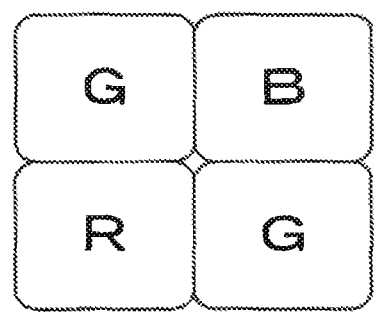
FIG. 3 shows the color filter Bayer array adopted in the first embodiment.

FIG. 3 shows the positional arrangement adopted for color filters disposed at the image sensor 111. Color filters in a Bayer array in FIG. 3 are each disposed at one of the image-capturing pixels arrayed in the two-dimensional pattern on the substrate of the image sensor 111. It is to be noted that while FIG. 3 shows the color filter positional arrangement corresponding to a four-pixel (2×2) image-capturing area, this image-capturing pixel unit adopting the color filter positional arrangement over the four-pixel area, as shown in the figure, is two-dimensionally reiterated. In the Bayer array, two pixels with G (green) filters disposed thereat are set at diagonal positions with the pair of remaining pixels, one with a B (blue) filter disposed thereat and the other with an R (red) filter disposed thereat, set at diagonal positions perpendicular to the G filter pixels. Thus, green pixels are disposed with higher density compared to red pixels and blue pixels in the Bayer array.

Figure 4:
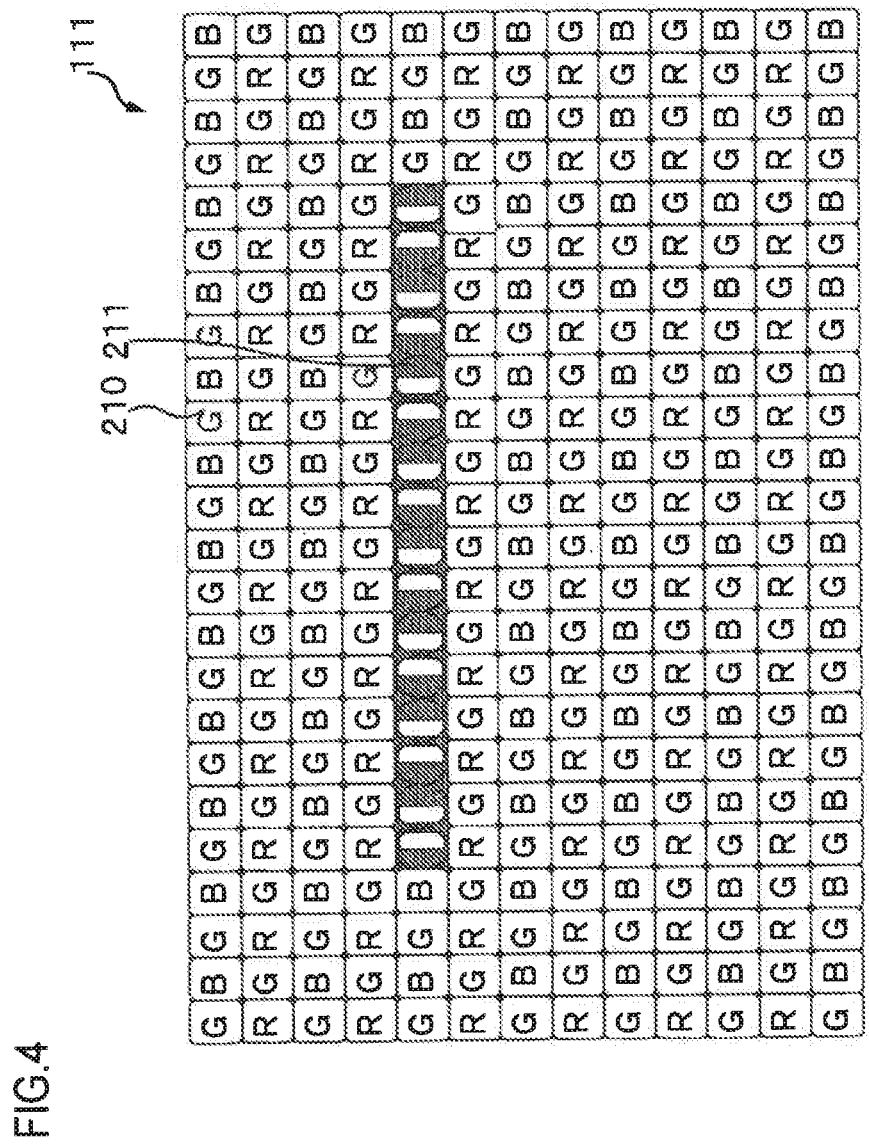
FIG. 4 shows in detail the image sensor achieved in the first embodiment.

FIG. 4 is a front view showing in detail the structure of the image sensor 111. It is to be noted that FIG. 4 shows the vicinity of a given focus detection area on the image sensor 111 in an enlargement. The image sensor 111 includes image-capturing pixels 210 and focus detection pixels 211 engaged in focus detection.

Figure 5A:
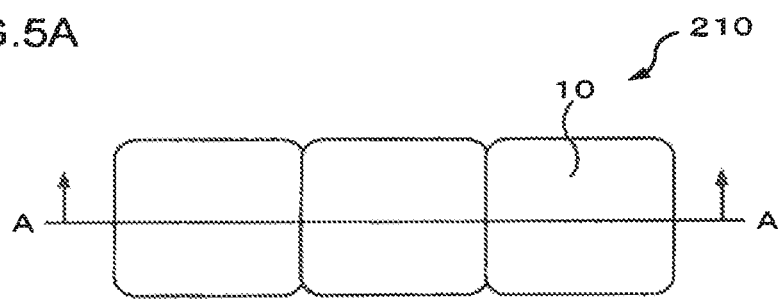
FIGS. 5A and 5B show the structure adopted for the image-capturing pixels in the first embodiment.
Figure 5B:
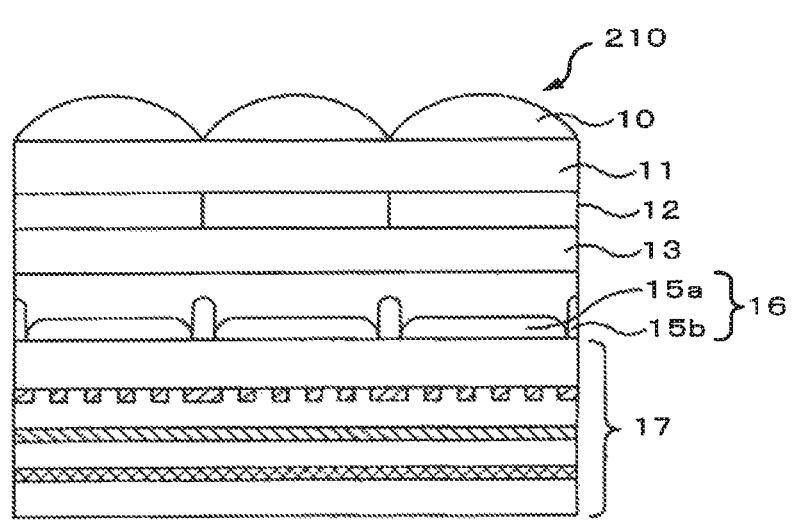

FIG. 5A shows image-capturing pixels 210 in a front view. FIG. 5B is a sectional view taken along A-A in FIG. 5A. The image-capturing pixels 210 are each constituted with a micro lens 10, a micro lens fixing layer 11, a color filter 12, a planarizing layer 13, a semiconductor layer 16 and a wiring layer 17. A photoelectric conversion unit 15a and a channel stop portion 15b are formed at one surface of the semiconductor layer 16.

Via the micro lens 10, light, having reached the surface of the image-capturing pixel 210 is condensed and directed onto the photoelectric conversion unit 15a. The micro lens 10 is attached onto the color filter 12 via the micro lens fixing layer 11. The color filter 12 is a resin layer through which light in a predetermined wavelength range is transmitted. The planarizing layer 13 is formed following the removal of a support substrate 60 through a manufacturing step to be detailed later (see FIG. 12A) so as to planarize the surface before forming the color filter 12.

The light having reached the photoelectric conversion unit 15a undergoes photoelectric conversion and the resulting signal charge is stored at the photoelectric conversion unit. The channel stop portion 15b, formed at the boundary between two image-capturing pixels 210, prevents entry of the signal charge generated at the photoelectric conversion unit 15a into a neighboring pixel. Wirings such as a signal output line, a power source line, a reset control line, a transfer gate control line and a row selection control line to be detailed later are present in the wiring layer 17. The wirings are to be described in detail later.

Figure 6A:
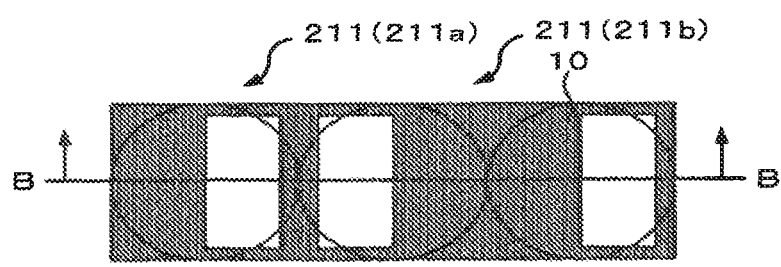
FIGS. 6A and 6B show the structure adopted for the focus detection pixels in the first embodiment.
Figure 6B:
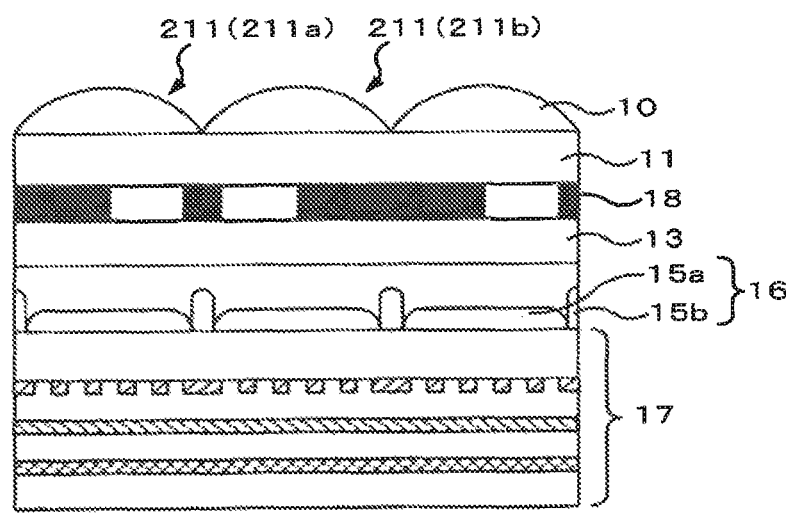

FIG. 6A shows focus detection pixels 211 in a front view. FIG. 6B is a sectional view taken along B-B in FIG. 6A. The focus detection pixels 211 are each constituted with a micro lens 10, a micro lens fixing layer 11, a light shielding film 18, a planarizing layer 13, a semiconductor layer 16 and a wiring layer 17. A photoelectric conversion unit 15a and a channel stop portion 15b are formed at one surface of the semiconductor layer 16. Since the micro lens 10, the micro lens fixing layer 11, the planarizing layer 13, the photoelectric conversion unit 15a, the channel stop portion 15b and the wiring layer 17 at the focus detection pixel fulfill functions similar to those at the image-capturing pixels 210, a repeated explanation is not provided.

The light shielding film 18 includes an opening ranging over the right half or the left half of the photoelectric conversion unit 15a in FIG. 6B, so as to allow incoming light to enter the right half or the left half of the photoelectric conversion unit. A focus detection pixel 211a at which light enters the right half of the photoelectric conversion unit 15a and a focus detection pixel 211b at which light enters the left half of the photoelectric conversion unit 15a are disposed alternately to each other in a reiterating pattern. The defocus quantity indicating the extent of defocusing is calculated by comparing the output distribution corresponding to the focus detection pixels 211a with the output distribution corresponding to the focus detection pixels 211b.

Figure 7:
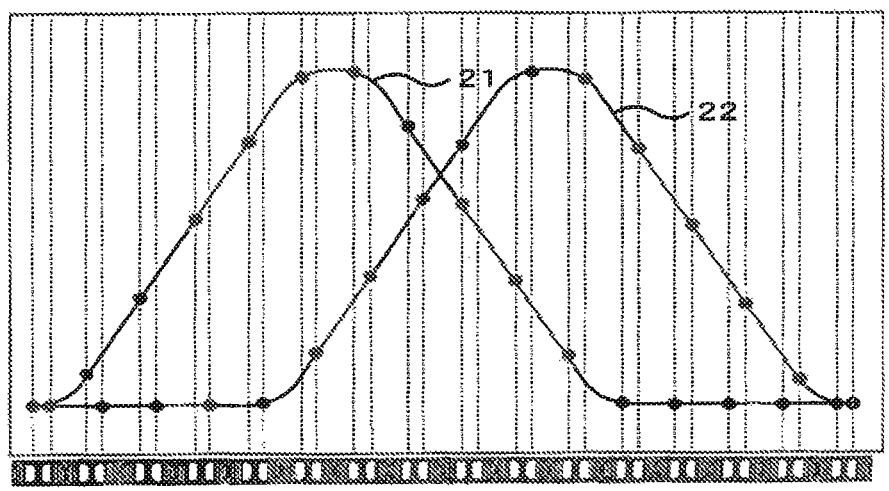
FIG. 7 presents a diagram in reference to which the split-pupil focus detection method adopted in the first embodiment is described.

Next, the focus detection method adopted in the embodiment is described in reference to FIG. 7. The focus is detected through the split-pupil method in this embodiment of the present invention. FIG. 7 is a diagram of distributions of the outputs from the focus detection pixels 211, which may be observed when the exchangeable lens 102 fails to achieve a focusing state. A curve 21 represents the output distribution corresponding to the focus detection pixels 211a. A curve 22 represents the output distribution corresponding to the focus detection pixels 211b. The focus detection pixels 211 are each disposed alternately to a focus detection pixel 211b. The diagram, with the curve 21 offset to the right relative to the curve 22, indicates the position of the focus detection pixels 211 is in a rear focus state.

By multiplying the image shift quantity indicated by the two output distribution curves 21 and 22 by a predetermined conversion coefficient, the extent of deviation (defocus quantity) of the current image forming plane (the image forming plane at the focus detection position relative to the position of the micro lenses 10 on the predetermined image forming plane) relative to the predetermined image forming plane can be calculated. The curve 21 and the curve 22 will be in alignment with each other when the exchangeable lens 102 achieves the focusing state.

Figure 8:
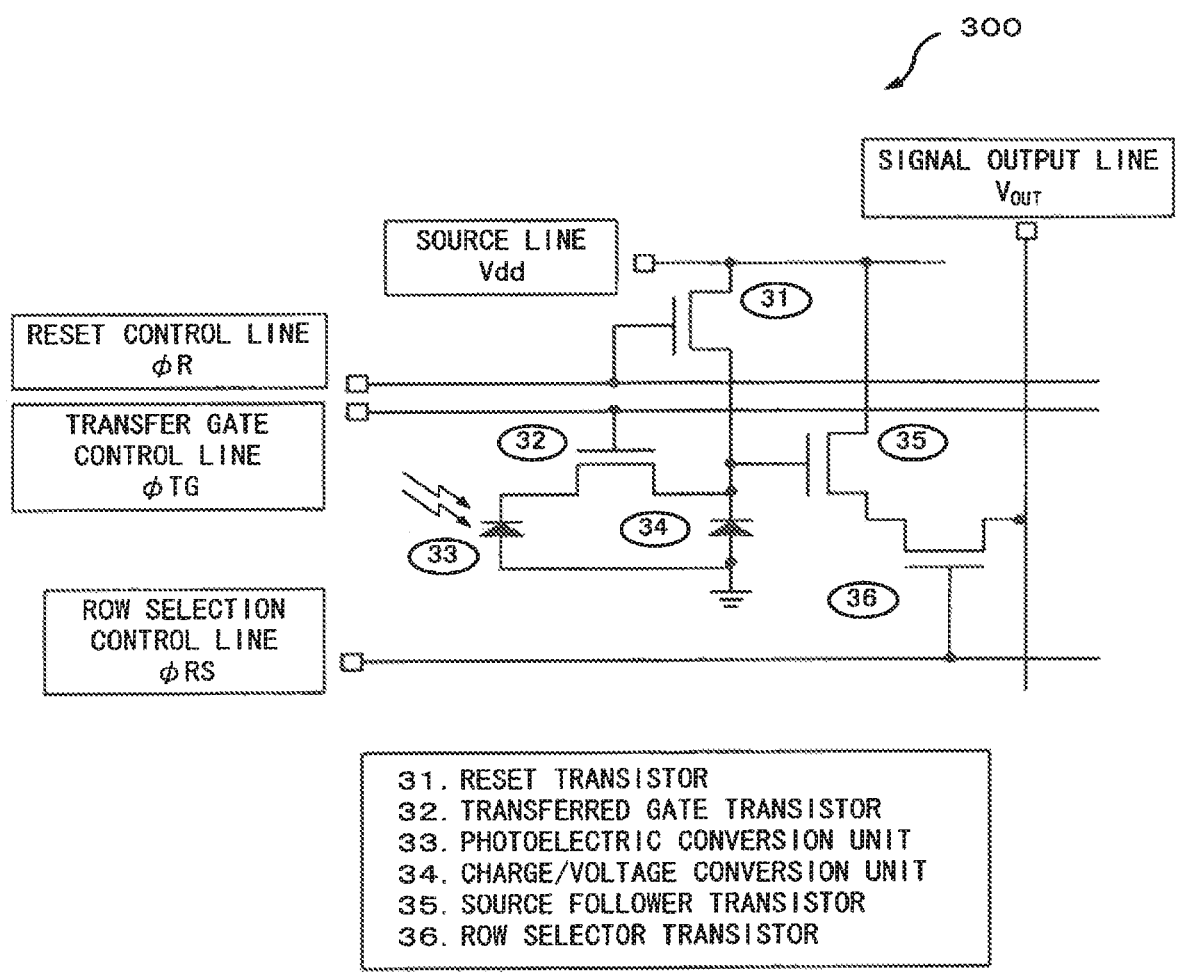
FIG. 8 shows the basic pixel structure assumed in the image sensor in the first embodiment.

In reference to FIG. 8, the basic pixel structure assumed at the image sensor 111 is described. As explained earlier, the image sensor 111 is a backside illumination 4TR-CMOS sensor and its basic pixel 300 is constituted with a photoelectric conversion unit 33, a charge/voltage conversion unit 34 and four transistors, i.e., a transfer gate transistor 32, a source follower transistor 35, a row selector transistor 36 and a reset transistor 31. In addition, a signal output line $V_{out}$, a source line Vdd, a reset control line ØR, a transfer gate control line ØTG and a row selection control line ØRS are connected to the basic pixel 300.

The reset transistor 31 resets the potential at the charge/voltage conversion unit 34 to the initial potential. The transfer gate transistor 32 transfers the signal charge resulting from the photoelectric conversion to the charge/voltage conversion unit 34. The light having reached the photoelectric conversion unit 33 undergoes photoelectric conversion and the resulting signal charge is stored at the photoelectric conversion unit as explained earlier. The charge/voltage conversion unit 34 assumes a floating capacitance with which the signal charge is converted to a potential, and the floating capacitance is generated by a diode that functions as a capacitor. The source follower transistor 35 amplifies the change in the potential at the charge/voltage conversion unit 34, which is attributable to the stored charge. The row selector transistor 36 is engaged in switching operation in order to select a specific basic pixel 300 for signal transfer.

The signal output line $V_{out}$, via which the signal output from the basic pixel 300 is transferred, is connected to the drain of the row selector transistor 36. The source line Vdd, via which power to be used in the amplification of the potential change at the charge/voltage conversion unit 34 is supplied, is connected to the source of the reset transistor 31. The reset control line ØR, via which the ON/OFF state of the reset transistor 31 is controlled, is connected to the gate of the reset transistor 31. The transfer gate control line ØTG is a wiring via which the signal charge transfer to the charge/voltage conversion unit 34 is controlled and is connected to the gate of the transfer gate transistor 32. The row selection control line ØRS, via which the ON/OFF state of the row selector transistor 36 is controlled, is connected to the gate of the row selector transistor 36.

Figure 9:
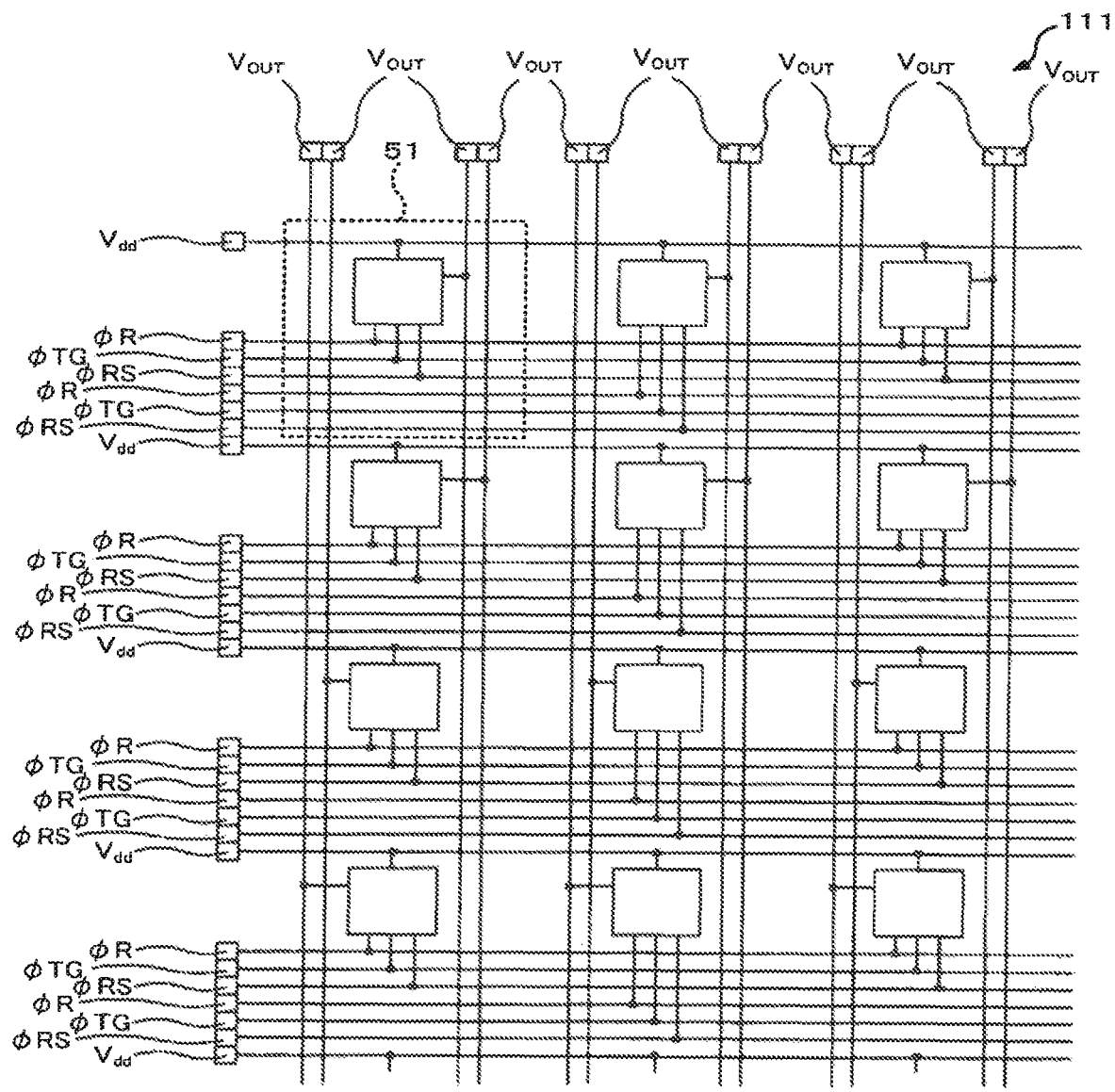
FIG. 9 illustrates wirings included in each pixel in the first embodiment.

In reference to FIG. 9, the wirings included in a single pixel are described. At the image sensor 111 shown in FIG. 9, two signal output lines $V_{out}$, two source lines Vdd, two reset control lines ØR, two transfer gate control lines ØTG and two row selection control line ØRS are installed in each row of pixels disposed in a side-by-side arrangement, and four signal output lines $V_{out}$ are installed in correspondence to each column of pixels. This structure allows the signals from a plurality of basic pixels 300 to be read out at once, which, in turn, improves the detection speed of the image sensor 111. Thus, the wirings in a given pixel 51 indicated by the dotted lines in FIG. 9 include wirings to connect with a specific basic pixel 300 as well as wirings connecting with other basic pixels 300 instead of the particular basic pixel 300. Thus, numerous wirings are included in each pixel.

Figure 10A:
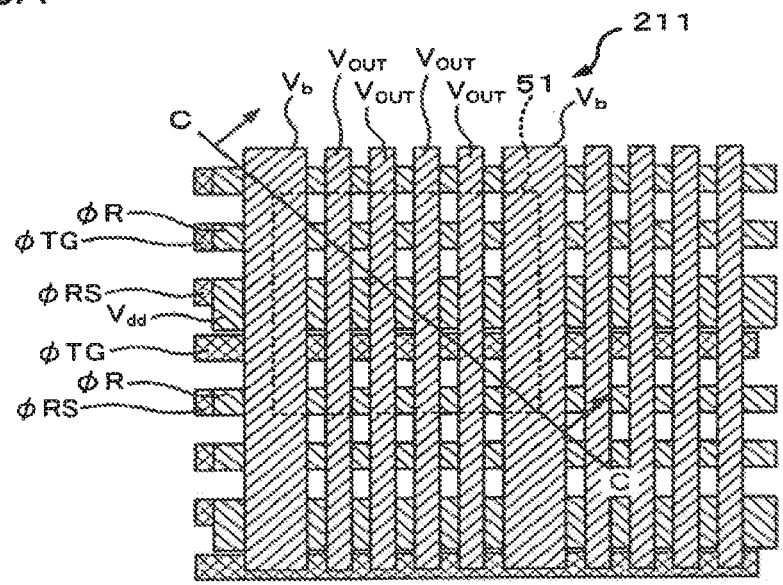
FIGS. 10A and 10B show the wirings laid out in the wiring layer in the first embodiment.
Figure 10B:
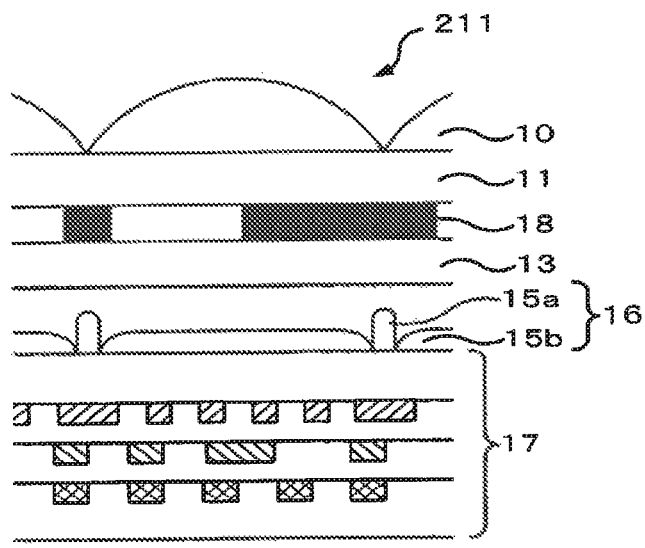

In reference to FIGS. 10A and 10B, wirings present in the wiring layer 17 at the image sensor 111 are described. FIG. 10A is a plan view of the wirings in the wiring layer 17, seen from the side where the micro lens 10 is present. FIG. 10B is a sectional view taken along C-C in FIG. 10A. As shown in FIGS. 10A and 10B, wirings are formed in a grid pattern over three strata within the wiring layer. In the first stratum viewed from the side where the photoelectric conversion unit 15a is present, four signal output lines $V_{out}$, and two bias lines Vb are formed, whereas two source lines Vdd and two reset control lines ØR are formed in the second stratum. In the third stratum, two transfer gate control lines ØTG and two row selection control lines ØRS are formed. The bias lines Vb are formed to prevent crosstalk.

As shown in FIG. 10B, the wirings can be formed in the wiring layer 17 free of any positional restrictions attributable to the presence of the photoelectric conversion unit 15a, since the wiring layer 17 is formed on the side opposite from the light entry side of the photoelectric conversion unit 15a. In other words, the structure in the embodiment allows wirings to be also formed in an area that will overlap the projected image of the light receiving area of the photoelectric conversion unit 15a, projected from the light receiving surface side at the image sensor 111. In contrast, a wiring layer at a front-side illumination image sensor must be formed on the light entry side of the photoelectric conversion unit 15a, requiring wirings to be formed without interfering with the light receiving area at the photoelectric conversion unit.

In addition, since the wiring layer 17 at the image sensor 111 in the embodiment is not subjected to any positional restrictions attributable to the presence of the photoelectric conversion unit 15a, the line width of the wirings can be increased to improve the signal transmission efficiency.

Next, in reference to FIGS. 11A through 13B, a method is described that may be adopted when manufacturing the image sensor 111 in the embodiment of the present invention. FIGS. 11A through 13B each illustrate a specific area of the image sensor 111 where focus detection pixels 211 are to be formed.

Figure 11A:
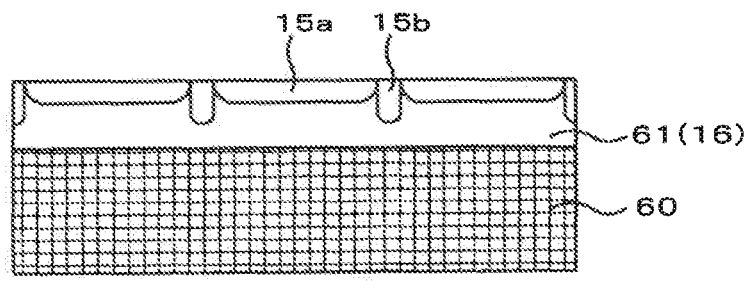
FIGS. 11A through 11C illustrate the manufacturing method through which the image sensor in the first embodiment is manufactured.
Figure 11B:
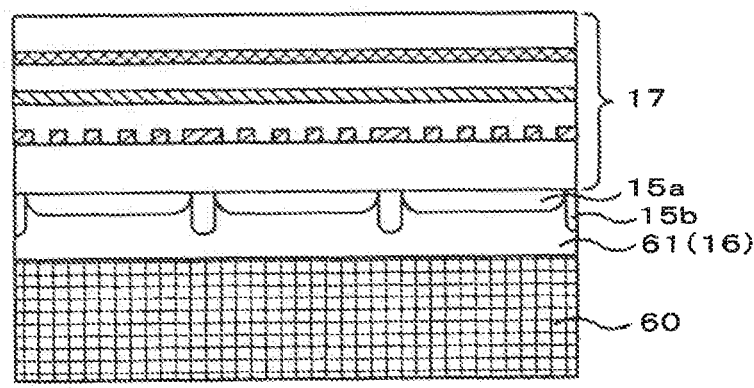
Figure 11C:
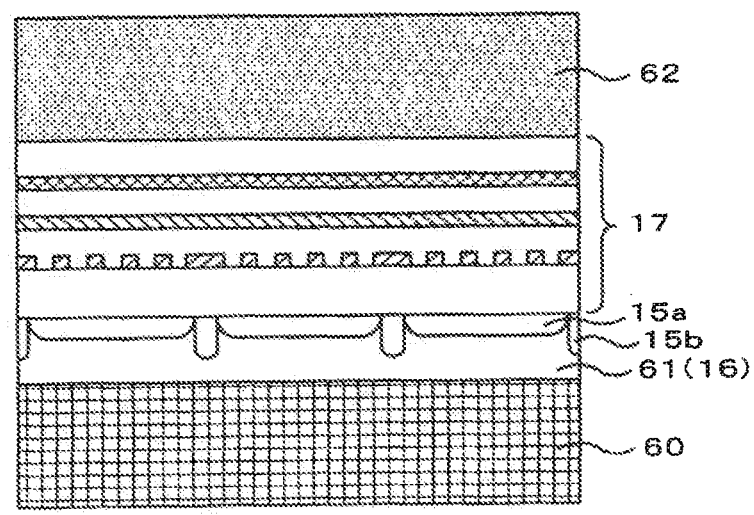

As shown in FIG. 11A, a P-type epitaxial layer 61 is formed over a semiconductor substrate 60, and photoelectric conversion units 15a, channel stop portions 15b and other elements (not shown) to constitute transistors and the like are formed by forming a diffusion layer at the surface of the P-type epitaxial layer 61. The P-type epitaxial layer 61 is equivalent to the semiconductor layer 16. Next, as shown in FIG. 11B, silicon oxide film formation through CVD and Al wiring formation through sputtering are executed multiple times, thereby forming the wiring layer 17 above the P-type epitaxial layer 61. Then, a support substrate 62 is bonded onto the wiring layer 17, as shown in FIG. 11C.

Figure 12A:
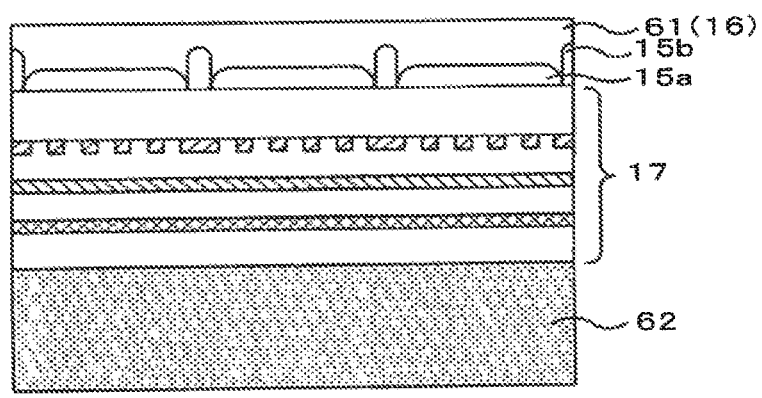
FIGS. 12A and 12B illustrate the manufacturing method through which the image sensor in the first embodiment is manufactured.
Figure 12B:
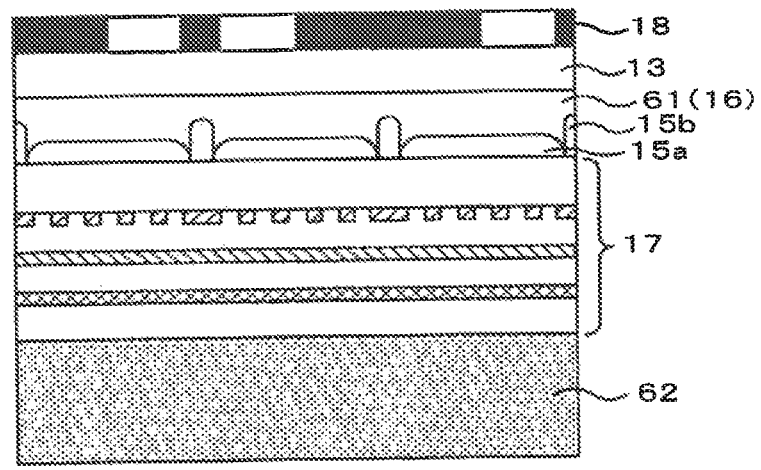

The semiconductor substrate 60 is removed through etching as shown in FIG. 12A. Next, as shown in FIG. 12B, a resin to constitute the planarizing layer 13 is evenly applied over the surface from which the semiconductor substrate 60 has been removed, so as to planarize the surface from which the semiconductor substrate 60 has been removed, and then a process of resin coating, drying the resin having been applied, pattern exposure and developing is executed multiple times so as to form the light shielding film 18 and color filters (not shown). The light shielding film 18 may be formed by dispersing black pigment such as titanium black or carbon black in the resin or by coloring the resin with a black dye. Color filters (not shown) may be formed by dispersing pigments corresponding to various colors (e.g., R, G and B) over the resin or by coloring the resin with dyes corresponding to the various colors (e.g., R, G and B).

Figure 13A:
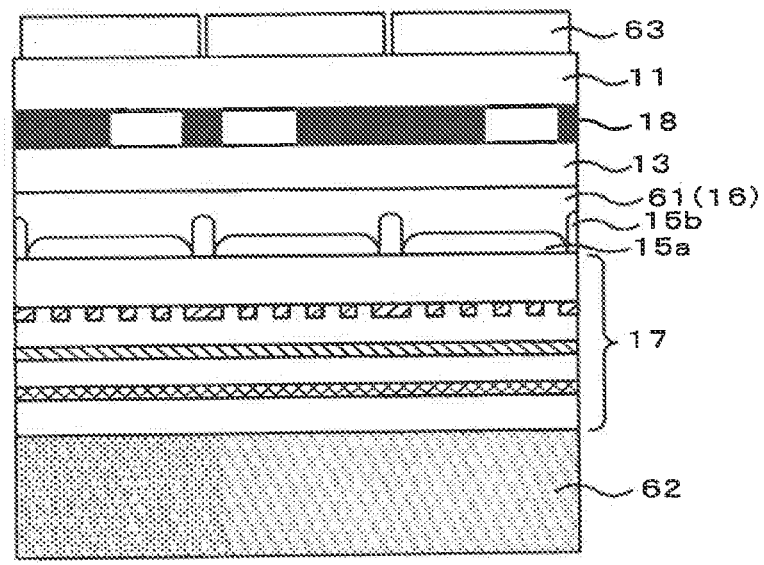
FIGS. 13A and 13B illustrate the manufacturing method through which the image sensor in the first embodiment is manufactured.
Figure 13B:
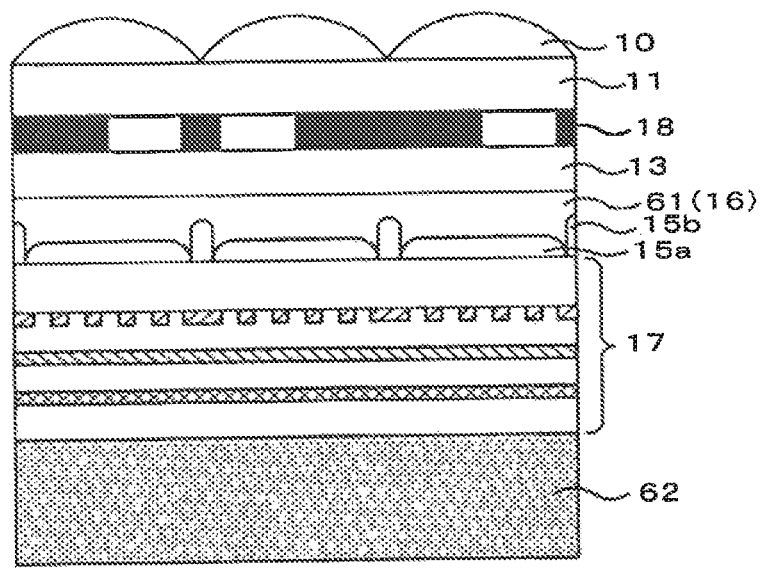

As shown in FIG. 13A, after a resin to constitute the micro lens fixing layer 11 is applied over the light shielding film 18 and the color filters (not shown), a resin to constitute the micro lenses 10 is applied and then patterned through a lithography process of the known art so as to form micro lens bases 63. Next, as shown in FIG. 13B, micro lenses 10 are formed by hot-forming the micro lens bases 63 into a semi-spherical shape on a hot plate or the like. The process for manufacturing the image sensor 111 is completed when the support substrate 62 is removed.

It is to be noted that while the micro lenses 10, the color filters 12 and the light shielding film 18 are essential components of the image sensor, it is not crucial that the image sensor include the micro lens fixing layer 11 or the planarizing layer 13.

The following advantages are achieved through the embodiment described above.

(1) The image-capturing pixels 210 and the focus detection pixels 211 each include the semiconductor layer 16 with a photoelectric conversion unit 15a formed at one surface thereof and the other surface thereof used as a light receiving surface and the wiring layer 17 with a wiring through which the signal from the photoelectric conversion unit 15a is read out present therein. The wiring layer 17 at the image-capturing pixels 210 and the wiring layer 17 at the focus detection pixel 211 are each formed on the surface of the respective semiconductor layer 16. Each image-capturing pixel 210 includes a color filter 12 through which light in a predetermined wavelength range is transmitted, formed at the other surface of the semiconductor layer 16, whereas each focus detection pixel 211 includes a light shielding film 18, via which part of the incoming light is blocked, is formed at the other surface of the semiconductor layer 16. Thus, no wirings through which signals from the photoelectric conversion units are to be read out are required between the micro lenses 10 and the photoelectric conversion units 15a and the light shielding film 18 and the color filters 12 do not overlap each other either. Consequently, the distance (depth) between the micro lenses 10 and the photoelectric conversion units 15a can be reduced, thereby assuring improved focus detection accuracy.

(2) The light shielding film 18 is constituted of a material prepared by dispersing black pigment such as titanium black or carbon black through a resin or by coloring a resin with black dye. As a result, the extent of reflection of the incoming light at the light shielding film 18 is minimized.

(3) The light shielding film 18 is constituted of a material prepared by dispersing black pigment such as titanium black or carbon black through a resin or by coloring a resin with black dye and the color filters 12 are constituted of a material prepared by dispersing pigments corresponding to specific colors (e.g., R, G and B) through a resin or by coloring the resin with dyes corresponding to the specific color (e.g., R, G and B). Since both the light shielding film and the color filters are constituted of resin, the light shielding film 18 can be formed through a process similar to the process for forming the color filters 12, thereby affording a high level of convenience. For instance, the light shielding film 18 can be formed through a process similar to the process for forming the color filter 12, through repeated execution of a process of resin coating, drying the resin, pattern exposure and developing processing. In addition, since the thickness of the light shielding film 18 manufactured through a process similar to the process for forming the color filters 12 can be controlled with ease, adjustment of the input characteristics is enabled. Furthermore, since the light shielding film 18 for blocking part of the incoming light is present in the layer corresponding to the layer at which the color filters 12 of the image-capturing pixels 210 are present, the light shielding film 18 can be formed during the process of forming the color filters 12, thereby affording further convenience.

(4) The image sensor 111 is manufactured by forming a P-type epitaxial layer 61 at the surface of a semiconductor substrate 60, forming photoelectric conversion units 15a at the surface of the P-type epitaxial layer 61, forming a wiring layer 17 over the photoelectric conversion units 15a, removing the semiconductor substrate 60 from the P-type epitaxial layer 61, forming a light shielding film 18 and color filters 12 on the surface of the P-type epitaxial layer 61 from which the semiconductor substrate 60 has been removed and forming micro lenses 10 above the light shielding film 18 and above the color filters 12. Since the light shielding film 18 and the color filters 12 are formed through a single process, the image sensor 111 can be manufactured with a high level of efficiency.

(5) Each focus detecting pixel 211 includes a wiring via which a signal, not from its photoelectric conversion unit 15a but from the photoelectric conversion unit of another pixel is read out, installed on the side where one surface of the semiconductor layer 16 is present. Since this structure allows wirings to be formed so as to allow signals at a plurality of basic pixels 300 to be read out at once, the detection speed of the image sensor 111 is improved.

(6) The wirings are installed by ensuring that they overlap the projected images of the light receiving areas of the photoelectric conversion units 15a, projected from the side where the light receiving surface of the image sensor 111 is present. As a result, the number of wirings formed at each focus detection pixel 211 can be increased or the width of the wirings formed at the focus detection pixel can be increased without significantly increasing the number of wiring installation strata. In the case of a front-side illumination image sensor, which requires wirings to be formed by ensuring that they do not overlap the light receiving areas of the photoelectric conversion units, an attempt at forming a greater number of wirings may result in an increase in the number of wiring strata or in a limited width that can be assumed for the wirings.

The embodiment described above allows for the following variations.

(1) The thickness of the light shielding film 18 may be different from the thickness of the color filters 12. Since the thickness of the light shielding film can be set differently from that of the color filters, the focus position can be adjusted as desired for the focus detection pixels 211.

(2) The position of the light shielding film 18 may be offset along the thickness of the image sensor 111 relative to the position of the color filters 12. By offsetting the position of the light shielding film to a specific extent, focus position adjustment for the focus detection pixels 211 is enabled.

(3) While the wiring layer 17 in the embodiment described above includes three wiring strata, the number of wiring strata in the wiring layer 17 is not limited to three. For instance, the wiring layer 17 may include up to 10 wiring strata, so as to increase the number of pixels, the signals from which are read out simultaneously, or to increase the number of pixels to be controlled simultaneously. The image sensor according to the present invention differs from a front-side illumination image sensor in that an increase in the wiring strata does not result in an increase in the distance between the micro lenses 10 and the photoelectric conversion units 15a. As an alternative, the number of wiring strata in the wiring layer 17 may be reduced to two in order to provide an image sensor with more limited functions and lower production costs.

(4) The light shielding film 18 may be constituted of a material prepared by dispersing pigments corresponding to all the colors, R, G and B assumed for the color filters 12 through the resin or by coloring the resin with dyes corresponding to all the colors, R, G and B assumed for the color filters. As an alternative, the light shielding film 18 may be formed by layering an R color filter, a G color filter and a B color filter one on top of another.

(5) While the image sensor 111 described above is a 4TR-CMOS sensor, the present invention may be adopted in conjunction with a backside illumination image sensor other than a 4TR-CMOS sensor. For instance, it may be adopted in conjunction with another CMOS sensor or in conjunction with a CCD (charge coupled device) sensor.

(6) While the light shielding film 18 in the embodiment fulfills a light shielding function only, the light shielding film 18 may also fulfill a function as an electrode or as wiring in addition to the light shielding function. For instance, the light shielding film 18 may be formed by using a dark colored, electrically conductive material so as to fulfill both the light shielding function and a conducting function (an electrode function or a wiring function). Such a light shielding film 18 with multiple functions may be constituted of a material prepared by, for instance, dissolving carbon black into an electrically conductive organic material (an electrically conductive high polymer material or an electrically conductive polymer material). It is to be noted that in such a case, control lines can be installed as the light shielding film 18 with better convenience by disposing focus detection pixels so as to allow them to occupy a whole row at the image sensor rather than disposing focus detection pixels over only part of a row within the image sensor, as shown in FIG. 4.

By structuring the image sensor as described above, a further improvement in its functions can be achieved. For instance, signals may be read out from the pixels with higher speed or individual pixels may be controlled independently of one another. An additional function assumed at the light shielding film 18 may be, for instance, one of the following; the function as a signal line (a signal output line $V_{out}$), the function as a source line Vdd, the function as a control line (a reset control line ØR, a transfer gate control line ØTG or a row selection control and ØRS) and the function as a bias line Vb. With such a light shielding film fulfilling an additional function, it becomes possible to install a greater number of wirings to read out signals from a plurality of pixels at once or to control a plurality of pixels simultaneously, without having to increase the number of wiring strata in the wiring layer 17.

In addition, by allowing the light shielding film 18 to assume an electrode function or a wiring function, the signal lines, the control lines, the source lines and the bias lines can be isolated from one another with greater freedom. Certain lines among the signal lines, the control lines, the source lines and the bias lines should be formed away from other electrodes or wirings. By assuming the function of such a wiring at the light shielding film 18 and forming other wirings in the wiring layer 17, the wirings can be set apart from one another. For instance, crosstalk may occur when a signal line is formed near a control line. Accordingly, the function of either the signal line or the control line may be fulfilled via the light shielding film 18 and the other wiring may be formed in the wiring layer 17, so as to set the signal line away from the control line.

In such a case, a through hole passing through the P-type epitaxial layer 61 and the planarizing layer 13 may be formed through etching or the like and a wiring for electrically connecting the light shielding film 18 with a photoelectric conversion unit 15a or another element formed at the surface of the P-type epitaxial layer 61 may be formed by using this through hole.

Furthermore, by forming the color filters 12 and the light shielding film 18 with electrically conductive material, the entire layer at which the color filters 12 and the light shielding film 18 are present can be utilized as a functional layer functioning as a wiring or an electrode to assure a further improvement in the functions that the image sensor provides.

The first embodiment described above may be adopted in conjunction with any one of the variations or in conjunction with a plurality of variations. The variations described above may also be adopted in any conceivable combination.

Second Embodiment

The second embodiment achieved by adopting the present invention in an electronic camera functioning as an image-capturing device is described. The electronic camera achieved in the second embodiment adopts a structure similar to that of the electronic camera in the first embodiment and accordingly, a repeated explanation is not provided. It is to be noted that the same reference numerals are assigned to structural elements similar to those in the first embodiment. The following explanation focuses on the image sensor achieved in the second embodiment.

As is the image sensor in the first embodiment, the image sensor 111 achieved in the second embodiment is a backside illumination 4TR-CMOS (complementary metal oxide semiconductor) sensor. The 4TR-CMOS sensor assumes a four-transistor structure which, together with a photoelectric conversion unit, includes a transfer gate transistor, a source follower transistor, a row selector transistor and a reset transistor. A detailed description is to be provided later.

Figure 14:
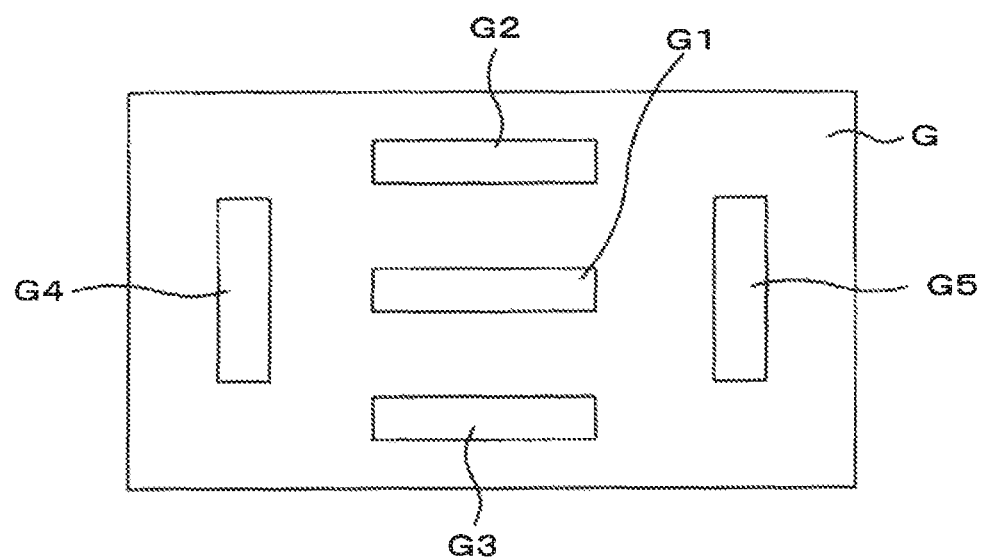
FIG. 14 shows focus detection areas assumed on the image-capturing plane set on the predetermined image forming plane of the exchangeable lens in a second embodiment.

FIG. 14 shows focus detection areas on an image-capturing plane G set on the predetermined image forming plane of the exchangeable lens 102. FIG. 14 is similar to FIG. 2 in reference to which the first embodiment has been described. Focus detection areas G1 through G5 are set on the image-capturing plane G and focus detection pixels are disposed in a linear formation along the longer side of each of the focus detection areas G1 through G5 set on the image-capturing plane G. Namely, focus detection pixel rows on the image sensor 111 sample the image portions in the focus detection areas G1 through G5 within the subject image formed on the photographic image plane G. The photographer manually selects a specific focus detection area among the focus detection areas G1 through G5 in correspondence to the desired photographic composition.

Figure 15:
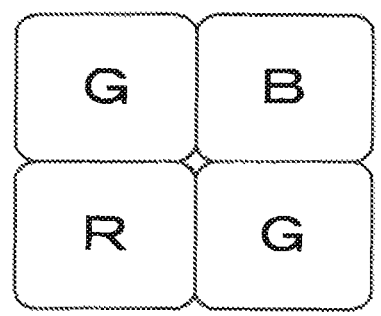
FIG. 15 shows the color filter Bayer array adopted in the second embodiment.

FIG. 15 shows the positional arrangement adopted for color filters disposed at the image sensor 111. FIG. 15 is similar to FIG. 3 in reference to which the first embodiment has been described. Color filters in the Bayer array in FIG. 15 are each disposed at one of the image-capturing pixels arrayed in a two-dimensional pattern on the substrate of the image sensor 111. It is to be noted that while FIG. 15 shows the color filter positional arrangement corresponding to a four-pixel (2×2) image-capturing area, this image-capturing pixel unit adopting the color filter positional arrangement over the four-pixel area, as shown in the figure, is two-dimensionally reiterated. In the Bayer array, two pixels with G (green) filters disposed thereat are set at diagonal positions with the pair of remaining pixels, one with a B (blue) filter disposed thereat and the other with an R (red) filter disposed thereat, set at diagonal positions perpendicular to the G filter pixels. Thus, green pixels are disposed with higher density compared to red pixels and the pixels in the Bayer array.

Figure 16:
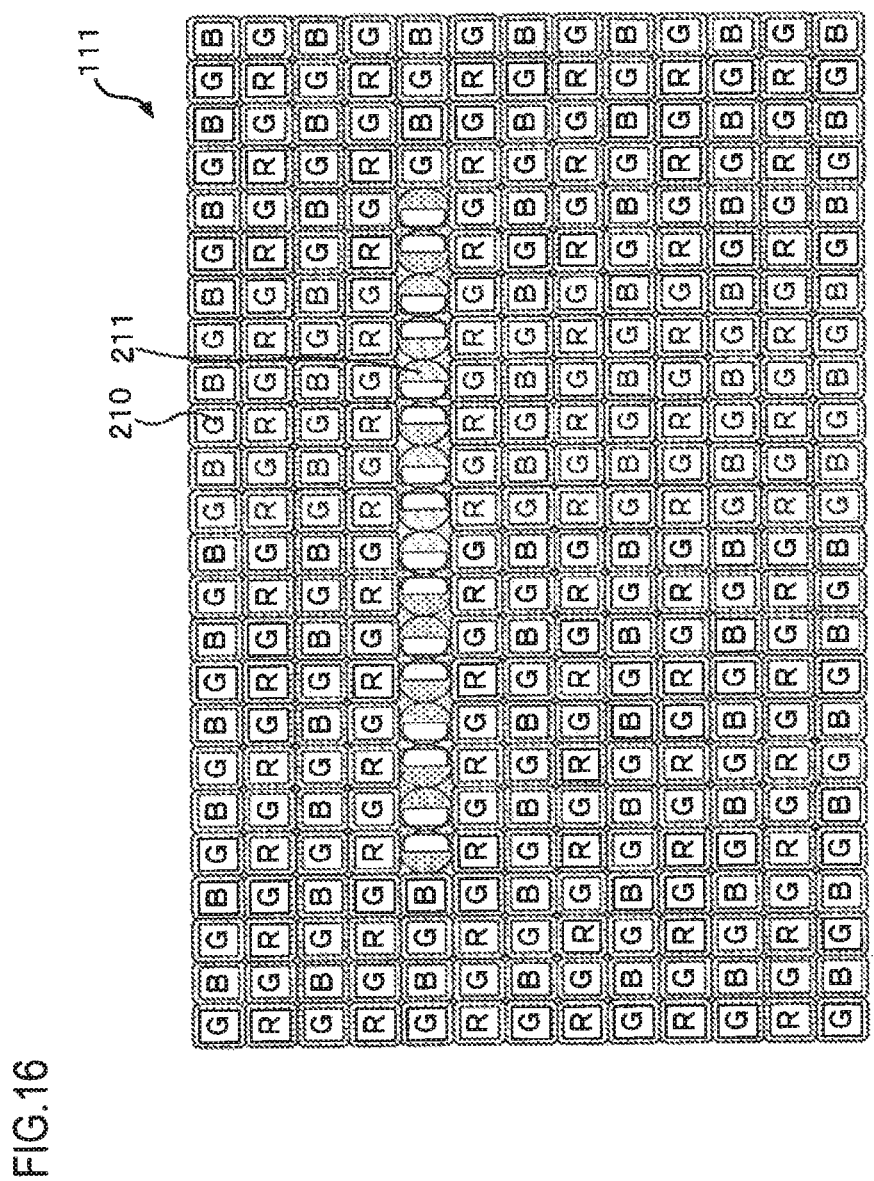
FIG. 16 shows in detail the image sensor achieved in the second embodiment.

FIG. 16 is a front view showing in detail the structure of the image sensor 111. It is to be noted that FIG. 16 shows the vicinity of a given focus detection area on the image sensor 111 in an enlargement. The image sensor 111 includes image-capturing pixels 210 and focus detection pixels 211 engaged in focus detection.

Figure 17A:
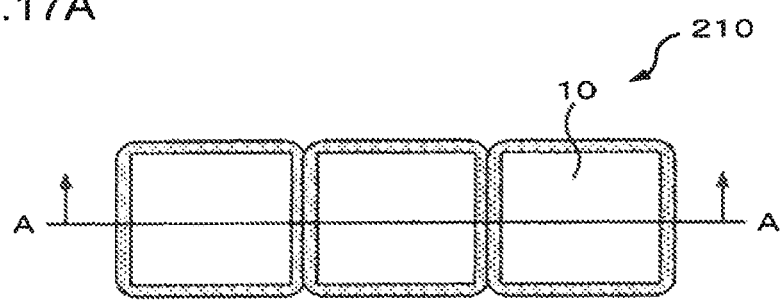
FIGS. 17A and 17B show the structure adopted for the image-capturing pixels in the second embodiment.
Figure 17B:
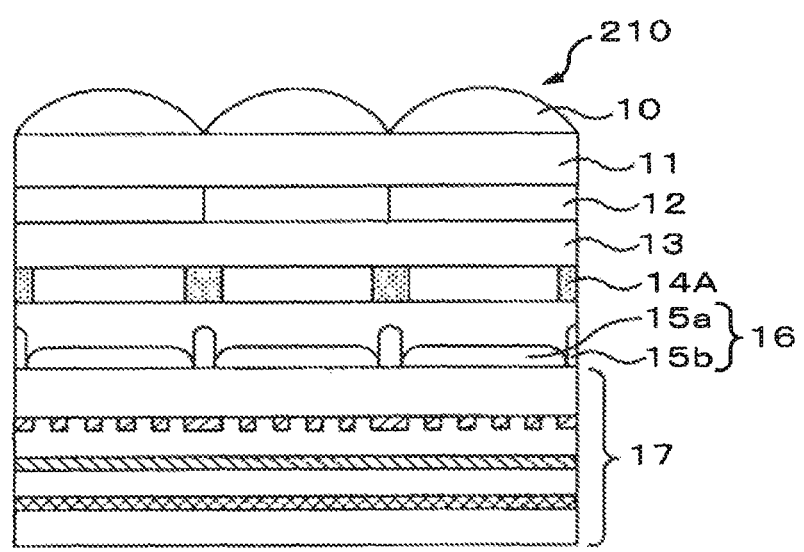

FIG. 17A shows image-capturing pixels 210 in a front view. FIG. 17B is a sectional view taken along A-A in FIG. 17A. The image-capturing pixels 210 are each constituted with a micro lens 10, a micro lens fixing layer 11, a color filter 12, a planarizing layer 13, a light shielding film 14A, a semiconductor layer 16 and a wiring layer 17. A photoelectric conversion unit 15a and a channel stop portion 15b are formed at one surface of the semiconductor layer 16.

Via the micro lens 10, light, having reached the surface of the image-capturing pixel 210 is condensed and directed onto the photoelectric conversion unit 15a. The micro lens 10 is attached onto the color filter 12 via the micro lens fixing layer 11. The color filter 12 is a resin layer through which light in a predetermined wavelength range is transmitted, and is formed by, for instance, dispersing pigment corresponding to a specific color (e.g., R, G or B) through the resin or by coloring the resin with a dye corresponding to a specific color (e.g., R, G or B). The planarizing layer 13 is formed after forming the light shielding film 14 through a manufacturing step to be detailed later (see FIG. 24B), so as to planarize the surface before forming the color filter 12.

With the light shielding film 14A, which shields the vicinity of the channel stop 15b from light, the occurrence of noise or color bleeding is prevented. Light having reached the photoelectric conversion unit 15a undergoes photoelectric conversion and the resulting signal charge is stored at the photoelectric conversion unit. The channel stop portion 15b formed at the boundary between two image-capturing pixels 210, prevents entry of the signal charge generated at the photoelectric conversion unit 15a into a neighboring pixel. Wirings such as a signal output line, a source line, a reset control line, a transfer gate control line and a row selection control line to be detailed later are present in the wiring layer 17. The wirings are to be described in detail later.

Figure 18A:
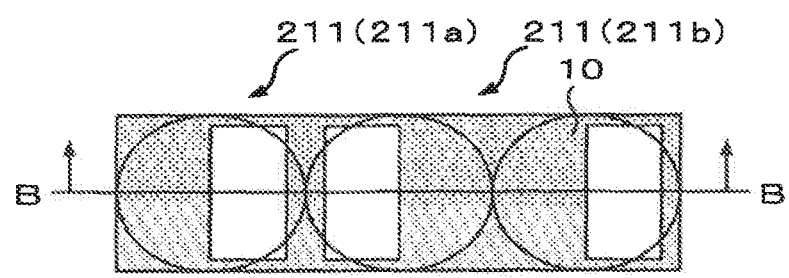
FIGS. 18A and 18B show the structure adopted for the focus detection pixels in the second embodiment.
Figure 18B:
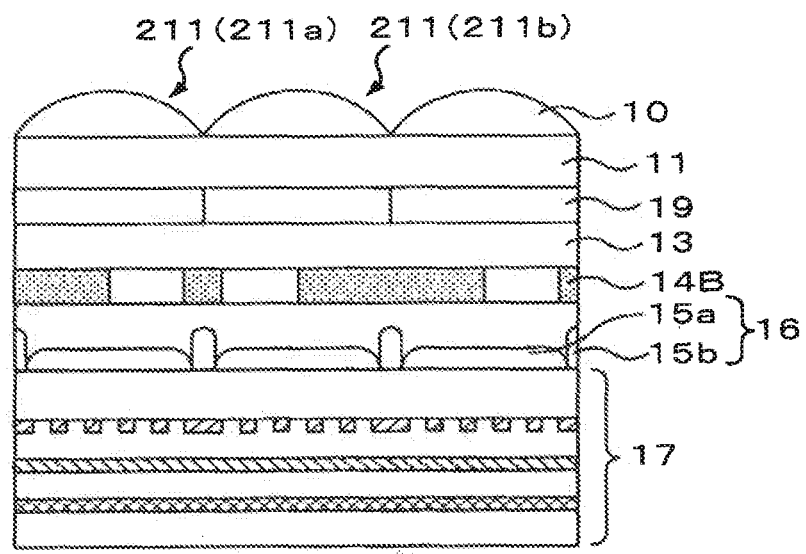

FIG. 18A shows focus detection pixels 211 in a front view. FIG. 18B is a sectional view taken along B-B in FIG. 18A. The focus detection pixels 211 are each constituted with a micro lens 10, a micro lens fixing layer 11, a transparent film 19, a planarizing layer 13, a light shielding film 14B, a semiconductor layer 16 and a wiring layer 17. A photoelectric conversion unit 15a and a channel stop portion 15b are formed at one surface of the semiconductor layer 16. Since the micro lens 10, the micro lens fixing layer 11, the planarizing layer 13, the photoelectric conversion unit 15a, the channel stop portion 15b and the wiring layer 17 at the focus detection pixel fulfill functions similar to those at the image-capturing pixels 210, a repeated explanation is not provided.

The light shielding film 14B includes an opening ranging over the right half or the left half of the photoelectric conversion unit 15a in FIG. 18B, so as to allow incoming light to enter the right half or the left half of the photoelectric conversion unit. A focus detection pixel 211a at which light enters the right half of the photoelectric conversion unit 15a and a focus detection pixel 211b at which light enters the left half of the photoelectric conversion unit 15b are disposed alternately to each other in a reiterating pattern. The defocus quantity indicating the extent of defocusing is calculated by comparing the output distribution corresponding to the focus detection pixels 211a with the output distribution corresponding to the focus detection pixels 211b. The transparent film 19 is a resin layer through which light over the full visible light wavelength range is transmitted.

Figure 19:
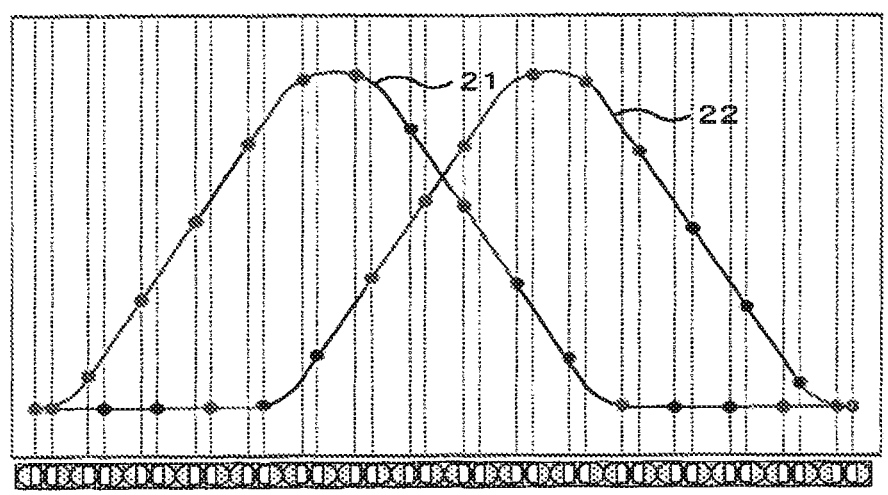
FIG. 19 presents a diagram in reference to which the split-pupil focus detection method adopted in the second embodiment is described.

Next, the focus detection method adopted in the embodiment is described in reference to FIG. 19. The focusing condition is detected through the split-pupil method in this embodiment of the present invention. FIG. 19 is a diagram of distributions of the outputs from the focus detection pixels 211, which may be observed when the exchangeable lens 102 fails to achieve a focusing state. A curve 21 represents the output distribution corresponding to the focus detection pixels 211a. A curve 22 represents the output distribution corresponding to the focus detection pixels 211b. The focus detection pixels 211a are each disposed alternately to a focus detection pixel 211b. The diagram, with the curve 21 offset to the right relative to the curve 22, indicates the position of the focus detection pixels 211 is in a rear focus state.

By multiplying the image shift quantity indicated by the two output distribution curves 21 and 2 by a predetermined conversion coefficient, the extent of deviation (defocus quantity) of the current image forming plane (the image forming plane at the focus detection position relative to the position of the micro lenses 10 on the predetermined image forming plane) relative to the predetermined image forming plane can be calculated. The curve 21 and the curve 22 will be in alignment with each other when the exchangeable lens 102 achieves the focusing state.

Figure 20:
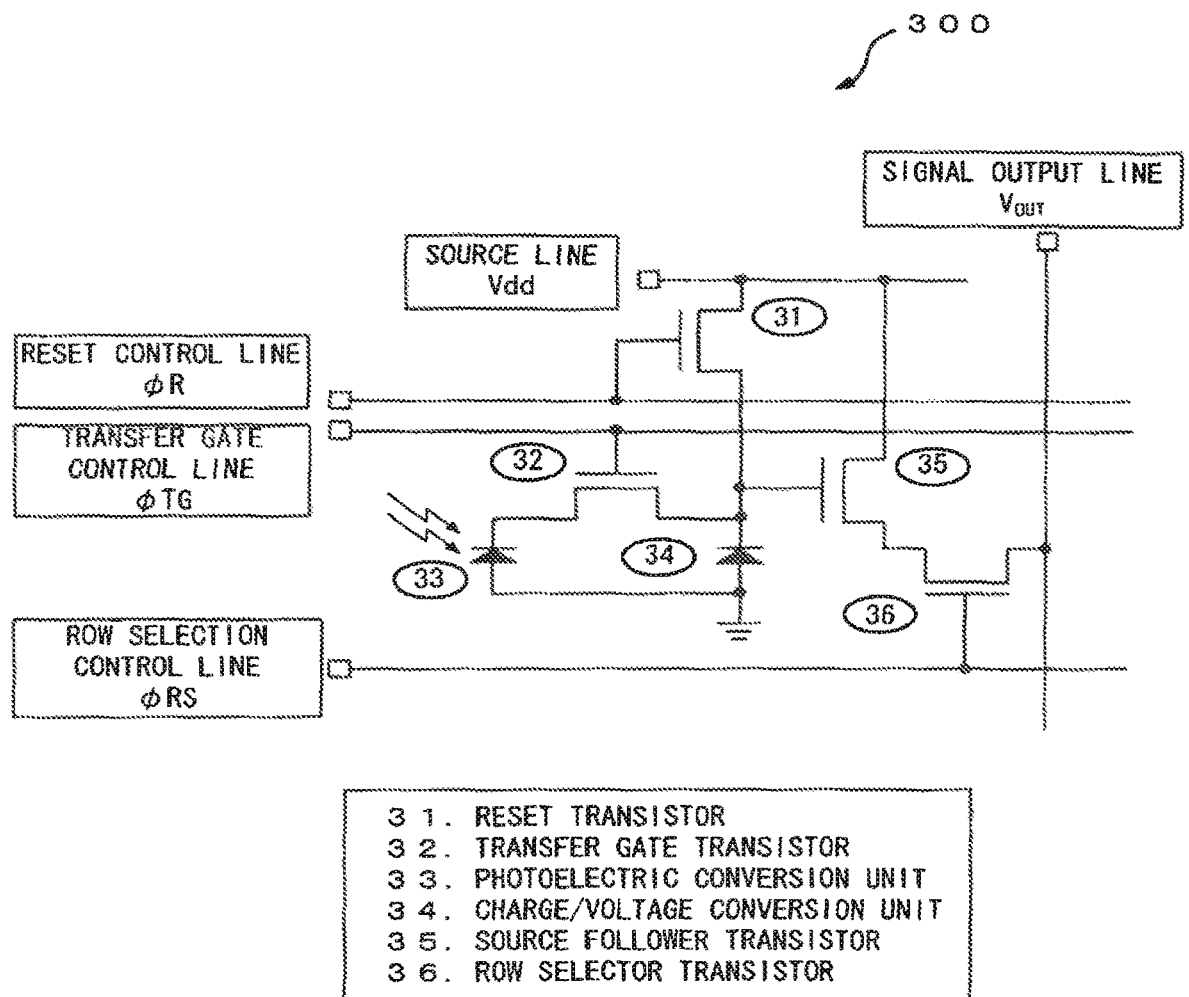
FIG. 20 shows the basic pixel structure assumed in the image sensor in the second embodiment.

In reference to FIG. 20, the basic pixel structure assumed at the image sensor 111 is described. FIG. 20 is similar to FIG. 8 in reference to which the first embodiment has been described. As explained earlier, the image sensor 111 is a backside illumination 4TR-CMOS sensor and its basic pixel 300 is constituted with a photoelectric conversion unit 33, a charge/voltage conversion unit 34 and four transistors, i.e., a transfer gate transistor 32, a source follower transistor 35, a row selector transistor 36 and a reset transistor 31. In addition, a signal output line $V_{out}$, a source line Vdd, a reset control line ØR, a transfer gate control line ØTG and a row selection control line ØRS are connected to the basic pixel 300.

The reset transistor 31 resets the potential at the charge/voltage conversion unit 34 to the initial potential. The transfer gate transistor 32 transfers the signal charge resulting from the photoelectric conversion to the charge/voltage conversion unit 34. The light having reached the photoelectric conversion unit 33 undergoes photoelectric conversion and the resulting signal charge is stored at the photographic conversion unit as explained earlier. The charge/voltage conversion unit 34 assumes a floating capacitance with which the signal charge is converted to a potential, and the floating capacitance is generated by a diode that functions as a capacitor. The source follower transistor 35 amplifies the change in the potential at the charge/voltage conversion unit 34, which is attributable to the stored charge. The row selector transistor 36 is engaged in switching operation in order to select a specific basic pixel 300 for signal transfer.

The signal output line $V_{out}$, via which the signal output from the basic pixel 300 is transferred, is connected to the drain of the row selector transistor 36. The source line Vdd, via which power to be used in the amplification of the potential change at the charge/voltage conversion unit 34 is supplied, is connected to the source of the reset transistor 31. The reset control line ØR, via which the ON/OFF state of the reset transistor 31 is controlled, is connected to the gate of the reset transistor 31. The transfer gate control line ØTG is a wiring via which the signal charge transfer to the charge/voltage conversion unit 34 is controlled, and is connected to the gate of the transfer gate transistor 32. The row selection control line ØRS, via which the ON/OFF state of the row selector switch 36 is controlled, is connected to the gate of the row selector transistor 36.

Figure 21:
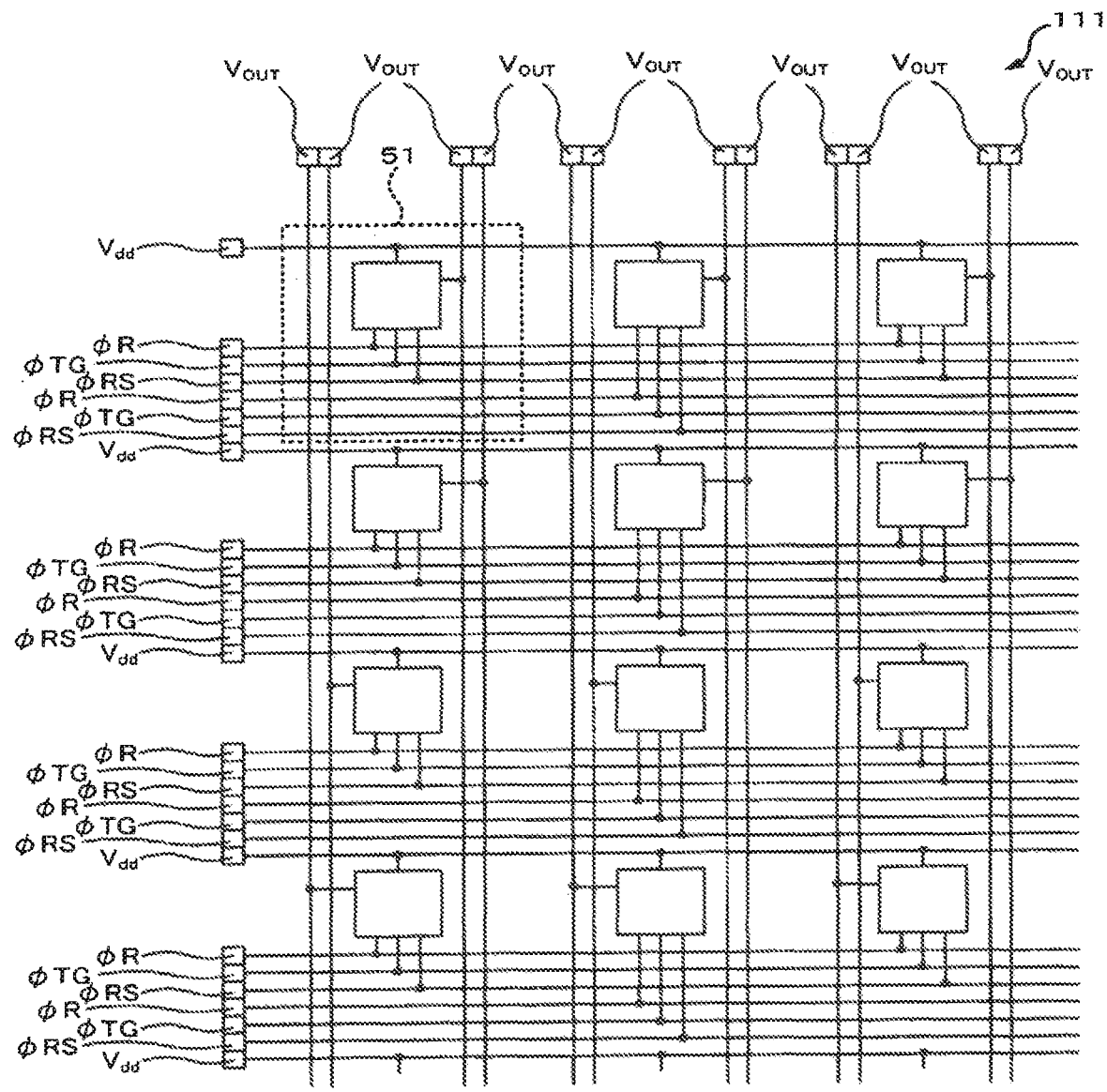
FIG. 21 illustrates wirings included in each pixel in the second embodiment.

In reference to FIG. 21, the wirings included in a single pixel are described. FIG. 21 is similar to FIG. 9 in reference to which the first embodiment has been described. At the image sensor 111 shown in FIG. 21, two signal output lines $V_{out}$, two source lines Vdd, two reset control lines ØR, two transfer gate control lines ØTG and two row selection control line ØRS are installed in each row of pixels disposed in a side-by-side arrangement, and four signal output lines $V_{out}$ are installed in correspondence to each column of pixels. This structure allows the signals from a plurality of basic pixels 300 to be read out at once, which, in turn, improves the detection speed of the image sensor 111. Thus, the wirings in a pixel 51, indicated by the dotted lines in FIG. 21 include wirings connecting with a specific basic pixel 300 as well as wirings connecting with other basic pixels 300 instead of the particular basic pixel 300. Thus, numerous wirings are included in each pixel.

Figure 22A:
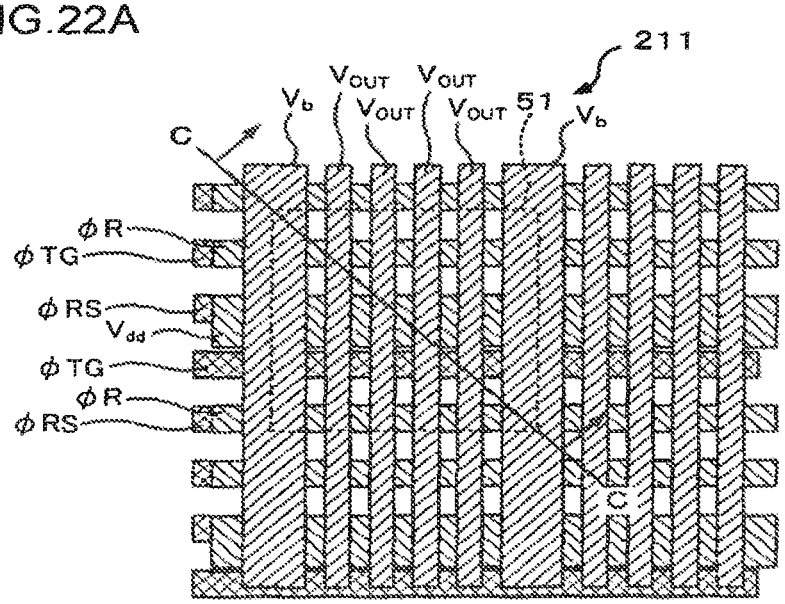
FIGS. 22A and 22B show the wirings laid out in the wiring layer in the second embodiment.
Figure 22B:
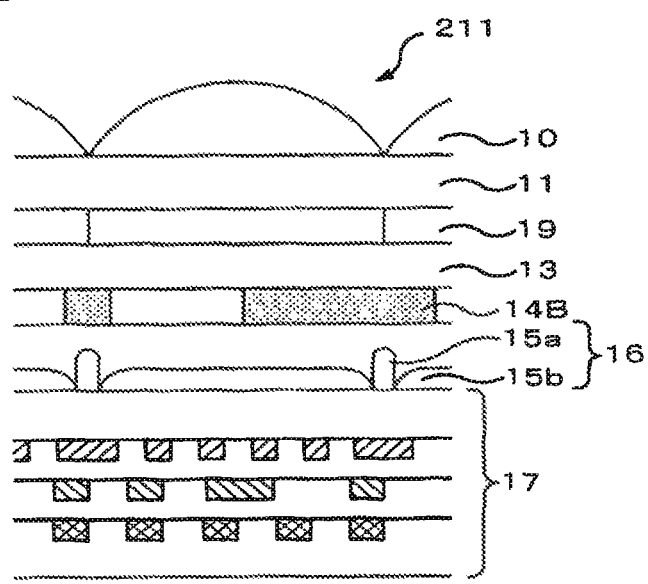

In reference to FIGS. 22A and 22B, wirings present in the wiring layer 17 at the image sensor 111 are described. FIG. 22A is a plan view of the wirings in the wiring layer 17, taken from the side where the micro lens 10 is present. FIG. 22B is a sectional view taken along C-C in FIG. 22A. As shown in FIGS. 22A and 22B, wirings are formed in a grid pattern over three strata within the wiring layer. In the first stratum viewed from the side where the photoelectric conversion unit 15a is present, four signal output lines $V_{out}$ and two bias lines Vb are formed, whereas two source lines Vdd and two reset control lines ØR are formed in the second stratum. In the third stratum, two transfer gate control lines ØTG and two row selection control lines ØRS are formed. The bias lines Vb are formed to prevent crosstalk.

As shown in FIG. 22B, the wirings can be formed in the wiring layer 17, free of any positional restrictions attributable to the presence of the photoelectric conversion unit 15a, since the wiring layer 17 is formed on the side opposite from the light entry side of the photoelectric conversion unit 15a. In other words, the structure in the embodiment allows wirings to also be formed in an area that will overlap the projected image of the light receiving area of the photoelectric conversion unit 15a, projected from the light receiving surface side at the image sensor 111. In contrast, a wiring layer at a front-side illumination image sensor must be formed on the light entry side of the photoelectric conversion unit 15a, requiring wirings to be formed without interfering with the light receiving area at the photoelectric conversion unit.

In addition, since the wiring layer 17 at the image sensor 111 in the embodiment is not subjected to any positional restrictions attributable to the presence of the photoelectric conversion unit 15a, the line width of the wirings can be increased to improve the signal transmission efficiency.

Next, a method that may be adopted when manufacturing the image sensor 111 in the embodiment of the present invention is described in reference to FIGS. 23A through 25B. FIGS. 23A through 25B each illustrate a specific area of the image sensor 111 where focus detection pixels 211 are to be formed.

Figure 23A:
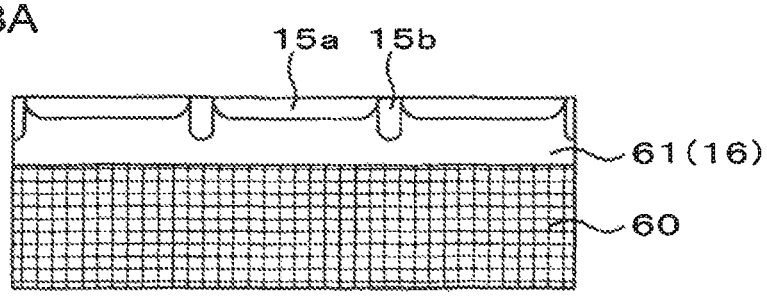
FIGS. 23A through 23C illustrate the manufacturing method through which the image sensor in the second embodiment is manufactured.
Figure 23B:
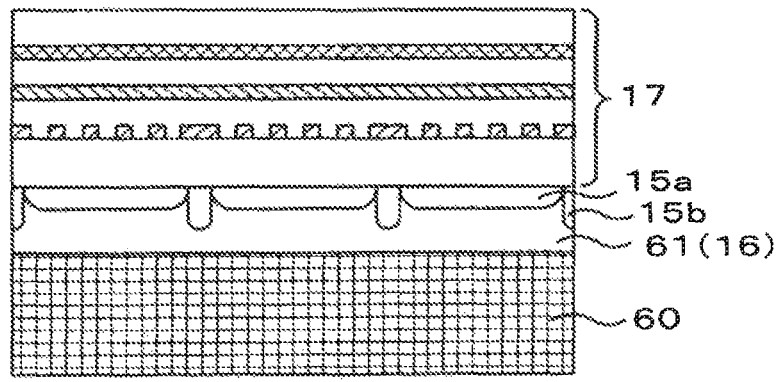
Figure 23C:
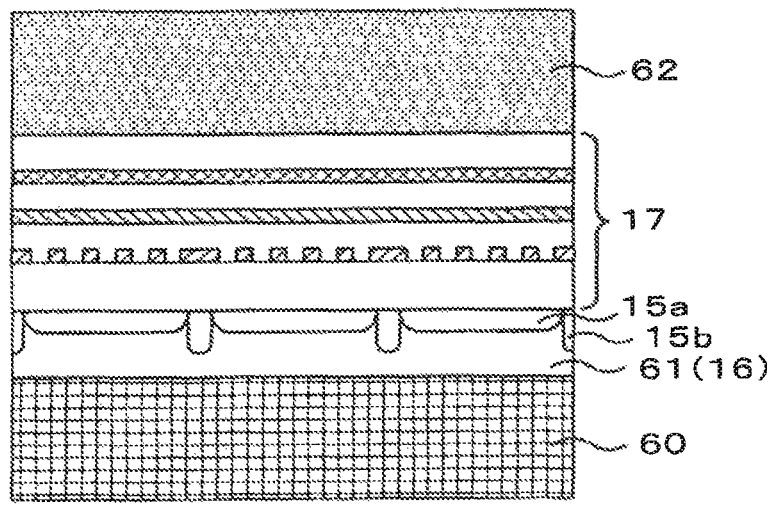

As shown in FIG. 23A, a P-type epitaxial layer 61 is formed over a semiconductor substrate 60, and photoelectric conversion units 15a, channel stop portions 15b and other elements (not shown) to constitute transistors and the like are formed by forming a diffusion layer at the surface of the P-type epitaxial layer 61. The P-type epitaxial layer 61 is equivalent to the semiconductor layer 16. Next, as shown in FIG. 23B, silicon oxide film formation through CVD and aluminum (Al) wiring formation through sputtering are executed repeatedly, thereby forming the wiring layer 17 above the P-type epitaxial layer 61. Then, a support substrate 62 is bonded onto the wiring layer 17, as shown in FIG. 23C.

Figure 24A:
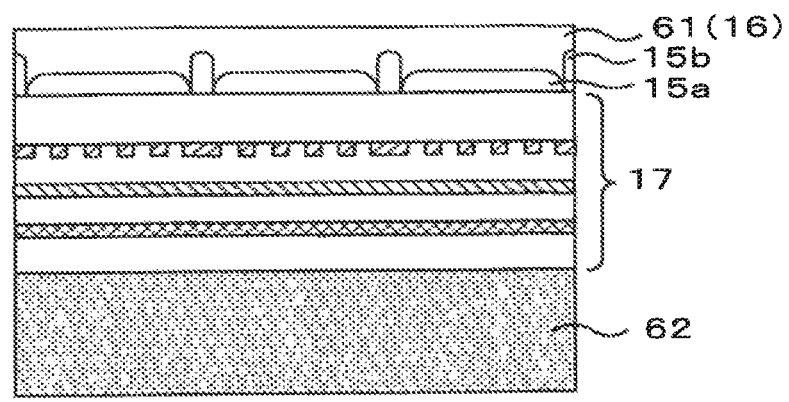
FIGS. 24A through 24C illustrate the manufacturing method through which the image sensor in the second embodiment is manufactured.
Figure 24B:
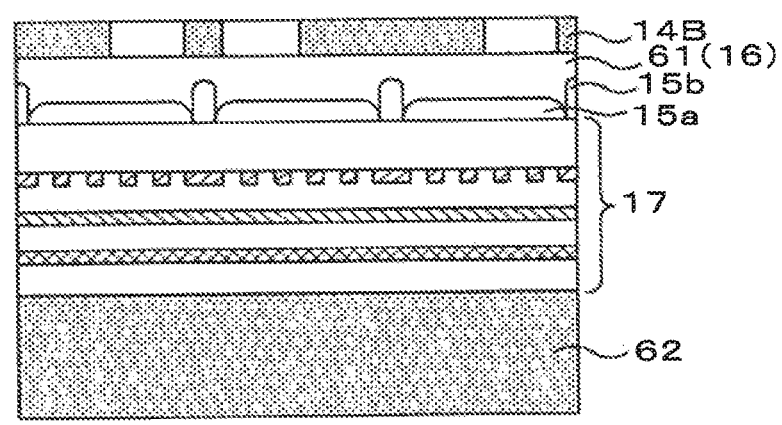
Figure 24C:
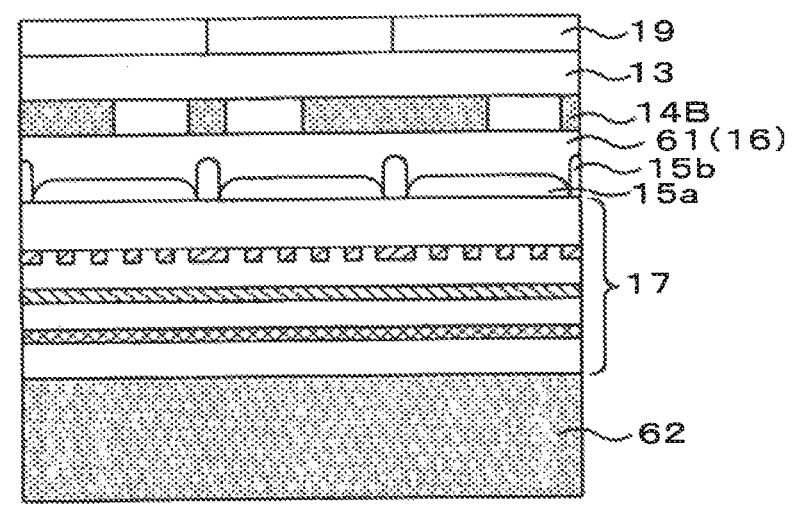

The semiconductor substrate 60 is then removed through etching as shown in FIG. 24A. Next, as shown in FIG. 24B, the light shielding film 14B, constituted of aluminum (Al), is formed through sputtering on the surface from which the semiconductor substrate 60 has been removed. Then, as shown in FIG. 24C, a resin to constitute the planarizing layer 13 is evenly applied over the light shielding film 14B so as to planarize the surface, before the transparent film 19 is formed. The transparent film 19 may be formed through a process of resin coating, drying the resin having been applied, pattern exposure and developing.

Figure 25A:
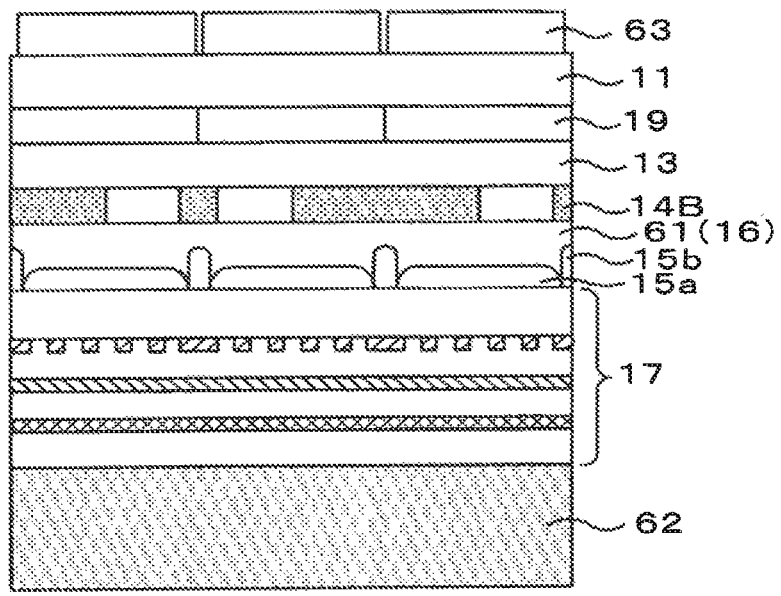
FIGS. 25A and 25B illustrate the manufacturing method through which the image sensor in the second embodiment Is manufactured.
Figure 25B:
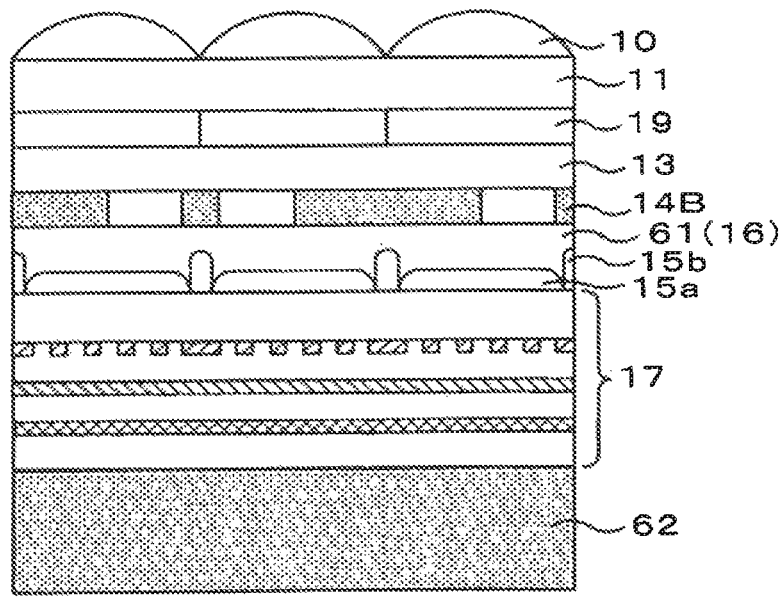

As shown in FIG. 25A, after a resin to constitute the micro lens fixing layer 11 is applied over the transparent film 19, a resin to constitute the micro lenses 10 is applied and then patterned through a lithography process of the known art so as to form micro lens bases 63. Next, as shown in FIG. 25B, micro lenses 10 are formed by hot-forming the micro lens bases 63 into a semi-spherical shape on a hot plate or the like. The process for manufacturing the image sensor 111 is completed when the support substrate 62 is removed.

Over an area where image-capturing pixels 210 are present, color filters 12, instead of the transparent film 19, are formed and the light shielding film 14A, instead of the light shielding film 14B, is formed. The color filters 12 and the transparent film 19 are formed through a common process, whereas the light shielding film 14A and the light shielding film 14B are formed through a common process.

It is to be noted that while the micro lenses 10, the color filters 12 and the transparent film 19 are essential components of the image sensor, it is not crucial that the image sensor include the micro lens fixing layer 11 or the planarizing layer 13.

The following advantages are achieved through the second embodiment described above.

(1) The image sensor 111 is a backside illumination image sensor equipped with a plurality of pixels disposed in a two-dimensional pattern, which includes focus detection pixels 211 and image-capturing pixels 210. Since this structure allows the substantial opening area at the light shielding film 14B at the focus detection pixels 211 to be set to a large value, an image sensor equipped with focus detection pixels can be provided even if the pixels are further miniaturized.

In addition, since the wiring layer is formed on the side opposite from the light entry side of the photoelectric conversion units 15a, the distance between the micro lenses 10 and the photoelectric conversion units 15a is reduced at least by the extent corresponding to the thickness of the wiring layer, compared to the corresponding distance at a front-side illumination image sensor with the wiring layer formed on the light entry side of the photoelectric conversion units 15a, and thus, better focus detection accuracy is assured.

(2) The focus detection pixels 211 each include the semiconductor layer 60 with the photoelectric conversion unit 15a formed at one surface thereof and the other surface thereof used as the light receiving surface, the light shielding film 14B, which blocks part of the light to enter the photoelectric conversion unit 15a, and a wiring $V_{out}$, through which the signal output from the photoelectric conversion unit 15a is read out. The wiring $T_{out}$ is formed on the side where the one surface of the semiconductor layer 60 is present, whereas the light shielding film 14B is formed on the side where the other surface of the semiconductor layer 16 is present. Since this structure reduces the distance (depth) between the micro lens 10 and the photoelectric conversion unit 15a, compared to the corresponding distance at a front-side illumination image sensor requiring a wiring via which the signal from the photoelectric conversion unit is read out, to be formed between the micro lens and the photoelectric conversion unit, better focus detection accuracy is assured.

(3) Each focus detecting pixel 211 includes a wiring via which the signal, not from its photoelectric conversion unit 15a but from the photoelectric conversion unit of another pixel, is read out, installed on the side where one surface of the semiconductor layer 16 is present. Since this structure allows wirings to be formed so as to allow signals at a plurality of basic pixels 300 to be read out at once, the detection speed of the image sensor 111 is improved.

(4) The wirings are installed by ensuring that they overlap the projected images of the light receiving areas of the photoelectric conversion units 15a, projected from the side where the light receiving surface of the image sensor 111 is present. As a result, the number of wirings formed at each focus detection pixel 211 can be increased or the width of the wirings formed at the focus detection pixel can be increased without significantly increasing the number of wiring installation strata. In the case of a front-side illumination image sensor, which requires wirings to be formed by ensuring that they do not overlap the light receiving areas of the photoelectric conversion units, an attempt at forming a greater number of wirings may result in an increase in the number of wiring strata or in a limited width that can be assumed for the wirings.

(5) Since a higher degree of freedom is afforded with regard to the shapes that the light shielding films 14A and 14B may assume, the pixel separation performance for the image-capturing pixels can be improved or the occurrence of the line-crawl phenomenon attributable to crosstalk or light leakage among pixels can be prevented effectively by selecting the optimal shapes for the light shielding films 14A and 14B.

(6) The image sensor 111 is manufactured by forming a P-type epitaxial layer 61 at the surface of a semiconductor substrate 60, formed photoelectric conversion units 15a at the surface of the P-type epitaxial layer 61, forming a wiring layer 17 over the photoelectric conversion units 15a, removing the semiconductor substrate 60 from the P-type epitaxial layer 61, forming light shielding films 14A and 14B on the surface of the P-type epitaxial layer 61 from which the semiconductor substrate 60 has been removed, forming a transparent film 19 and color filters 12 over the light shielding films 14A and 14B and forming micro lenses 10 over the transparent film 19 and the color filters 12. Through this process, the backside illumination image sensor can be manufactured with a high level of efficiency.

The second embodiment described above allows for the following variations.

(1) The light shielding films 14A and 14B may each assume an electrode function or a wiring function. An image sensor with such light-shielding films will provide improved functions. For instance, signals may be read out from the pixels with higher speed or individual pixels may be controlled independently of one another. An additional function assumed at the light shielding film 14A or 14B may be, for instance, one of the following; the function as a signal line (signal output line $V_{out}$, the function as a source line Vdd, the function as a control line (a reset control line ØR, a transfer gate control line ØTG or a row selection control and ØRS and the function as a bias line Vb. With such a light shielding film fulfilling an additional function, it becomes possible to install a greater number of wirings to read out signals from a plurality of pixels at once or to control a plurality of pixels simultaneously, without having to increase the number of wiring strata in the wiring layer 17.

In addition, by allowing the light shielding films 14A and 14B to assume an electrode function or a wiring function, the signal lines, the control lines, the source lines and the bias blinds can be isolated from one another with greater freedom. Certain lines among the signal lines, the control lines, the source lines and the bias lines should be formed away from other electrodes or wirings. By assuming the function of such a wiring at the light shielding film 14A or 14B and forming other wirings in the wiring layer 17, the wirings can be set apart from one another. For instance, crosstalk may occur when a signal line is formed near a control line. Accordingly, the function of either the signal line or the control line may be assumed at the light shielding film 14A or 14B and the other wiring may be formed in the wiring layer 17 so as to set the signal line away from the control line.

In such a case, a through hole passing through the P-type epitaxial layer 61 may be formed through etching or the like and a wiring for electrically connecting the light shielding film 14A or 14B with a photoelectric conversion unit 15a or another element formed at the surface of the P-type epitaxial layer 61 may be formed by using this through hole.

(2) While the wiring layer 17 in the embodiment described above includes three wiring strata, the number of wiring strata in the wiring layer 17 is not limited to three. For instance, the wiring layer 17 may include up to 10 wiring strata, so as to increase the number of pixels, the signals from which are read out simultaneously or to increase the number of pixels to be controlled simultaneously. The image sensor according to the present invention differs from a front-side illumination image sensor in that an increase in the wiring strata does not result in an increase in the distance between the micro lenses 10 and the photoelectric conversion units 15a. As an alternative, the number of wiring strata in the wiring layer 17 may be reduced to two in order to provide an image sensor with more limited functions at lower cost.

(3) The light shielding films 14A and 14B may assume a floating state, or a voltage may be applied to the light shielding films 14A and 14B by applying a bias to the light shielding films 14A and 14B or by fixing the light shielding films 14A and 14B to the source. Through these measures, the load capacity can be adjusted or crosstalk can be effectively prevented.

(4) While the light shielding films 14A and 14B are constituted of aluminum (Al), i.e., a material assuring high reflectance, they may instead be constituted of a metal having a reflectance equal to or less than a predetermined level lower than the reflectance of aluminum (Al). For instance, tungsten (W), titanium (Ti) or tin (Sn) may be used to form the light shielding films 14A and 14B. With the light shielding films 14A and 14B constituted with any of these materials, the extent to which the quality of the image photographed with the electronic camera 101 is adversely affected by light reflected off the light shielding films 14A and 14B and entering the photoelectric conversion units 15a, can be reduced. In addition, instead of tungsten (W), titanium (Ti) or tin (Sn), a metal with a reflectance equal to or lower than the visible light reflectance of tungsten (W), a metal with a reflectance equal to or lower than the visible light reflectance of titanium (Ti) or a metal with a reflectance equal to or lower than the visible light reflectance of tin (Sn), may be used.

As an alternative, the light shielding films 14A and 14B may be formed by using an oxide or a nitride that does not allow light to be transmitted through at a reflectance equal to or less than a predetermined value lower than the reflectance of aluminum (Al). For instance, an oxide or a nitride that does not allow visible light to be transmitted through, assuming a reflectance equal to or less than the visible light reflectance of tungsten (W), equal to or less than the visible light reflectance of titanium (Ti) or equal to or less than the visible light reflectance of tin (Sn) may be used to form the light shielding films. Oxides that may be used for these purposes include, for instance, tungsten oxide, titanium oxide and tin oxide, whereas nitrides that may be used for the same purposes include, for instance, tungsten nitride, titanium nitride and tin nitride. The light shielding films 14A and 14B are formed through CVD or sputtering after the semiconductor substrate 60 is removed (see FIG. 24A).

(5) While the light shielding films 14A and 14B are constituted of aluminum (Al), i.e., a material assuring high reflectance, a resin that does not allow light to be transmitted through at a reflectance equal to or less than a predetermined level lower than the reflectance of aluminum (Al) may be used when forming the light shielding films. For instance, a photo-curing resin containing black pigment such as titanium black or carbon black or a photo-curing resin colored with black dye may be used to form the light shielding films 14A and 14B. With the light shielding films 14A and 14B constituted of such a material, entry of light reflected off the light-shielding films 14A and 14B into the photoelectric conversion units 15a can be prevented. As a further alternative, a resin that does not allow visible light to be transmitted through, assuming a reflectance equal to or less than the visible light reflectance of tungsten (W), equal to or less than the visible light reflectance of titanium (Ti) or equal to or less than the visible light reflectance of tin (Sn) may be used instead of a photo-curing resin containing black pigment such as titanium black or carbon black or a photo-curing resin colored with black dye. Such light shielding films 14A and 14B may be formed through a process of resin coating, drying the resin having been applied, pattern exposure and developing processing, executed after removing the semiconductor substrate 60 (see FIG. 24A).

(6) A film constituted of a metal with a reflectance equal to or less than a predetermined level lower than the reflectance of aluminum (Al) may be formed over the surfaces of the light shielding films 14A and 14B. For instance, a film constituted of tungsten (W), titanium (Ti) or tin (Sn) may be formed over the surfaces of the light shielding films 14A and 14B. With such a film formed over the surfaces of the light shielding films, entry of light reflected off the light shielding films 14A and 14B into the photoelectric conversion units 15a is effectively prevented. In addition, instead of tungsten W), titanium (Ti) or tin (Sn), a metal with a reflectance equal to or less than the visible light reflectance of tungsten (W), equal to or less than the visible light reflectance of titanium (Ti) or equal to or less than the visible light reflectance of tin (Sn) may be used when forming a film over the surfaces of the light shielding films 14A and 14B.

As an alternative, a film constituted of an oxide or a nitride that does not allow light to be transmitted through at a reflectance equal to or less than a predetermined level lower than the reflectance of aluminum (Al) may be formed over the surfaces of the light shielding films 14A and 14B. For instance, a film constituted of an oxide or a nitride that does not allow visible light to be transmitted through, assuming a reflectance equal to or less than the visible light reflectance of tungsten (W), equal to or less than the visible light reflectance of titanium (Ti) or equal to or less than the visible light reflectance of tin (Sn), may be formed over the surfaces of the light shielding films 14A and 14B. Oxides that may be used for these purposes include, for instance, tungsten oxide, titanium oxide and tin oxide, whereas nitrides that may be used for the same purposes include, for instance, tungsten nitride, titanium nitride and tin nitride. Such a film may be formed through CVD or sputtering after the light shielding films 14A and 14B are formed (see FIG. 24B).

(7) A film constituted of a resin that does not allow light to be transmitted at a reflectance equal to or less than a predetermined level lower than the reflectance of aluminum (Al) may be formed over the surfaces of the light shielding films 14A and 14B. For instance, a film constituted of a photo-curing resin containing black pigment such as titanium black or carbon black or a photo-curing resin colored with black dye may be formed over the surfaces of the light shielding films 14A and 14B. With such a film, entry of light reflected off the light shielding films 14A and 14B into the photoelectric conversion units 15a can be prevented effectively. As an alternative, a film constituted of a resin that does not allow visible light to be transmitted through, assuming a reflectance equal to or less than the visible light reflectance of tungsten (W), equal to or less than the visible light reflectance of titanium (Ti) or equal to or less than the visible light reflectance of tin (Sn) may be formed over the surfaces of the light shielding films 14A and 14B instead of a film constituted of a photo-curing resin containing black pigment such as titanium black or carbon black or a photo-curing resin colored with black dye. Such a film may be formed through a process of resin coating, drying the resin having been applied, pattern exposure and developing processing, executed after forming the light shielding films 14A and 14B (see FIG. 24B).

(8) A film constituted of a material with a reflectance thereof equal to or less than the predetermined level described above may be formed over the surfaces of the light shielding films 14A and 14B constituted of a material with a reflectance equal to or less than the predetermined level described above. Through these measures, the entry of light reflected off the light shielding films 14A and 14B into the photoelectric conversion units 15a can be suppressed even more effectively.

(9) While the image sensor 111 described above is a 4TR-CMOS sensor, the present invention may be adopted in conjunction with a backside illumination image sensor other than a 4TR-CMOS sensor. For instance, it may be adopted in conjunction with another type of CMOS sensor or in conjunction with a CCD (charge coupled device) sensor.

The second embodiment described above may be adopted in conjunction with any one of the variations or in conjunction with a plurality of variations. The variations described above may also be adopted in any conceivable combination.

It is to be noted that the operations and advantages described in reference to the first embodiment are also achieved through the second embodiment and that the operations and advantages described in reference to the second embodiment are also achieved through the first embodiment. In addition, some of the variations of the first embodiment may also be achieved in conjunction with the second embodiment, whereas some of the variations of the second embodiment may also be achieved in conjunction with the first embodiment.

The above described embodiments are examples, and various modifications can be made without departing from the scope of the invention.

What is claimed is:
1. An image sensor comprising:
a first microlens upon which light is incident;
a second microlens upon which light is incident;
a first member having a first opening through which light is transmitted from the first microlens;
a second member having a second opening through which light is transmitted from the second microlens, an opening area of the second opening being smaller than an opening area of the first opening;
a first photoelectric converter that converts light from the first opening to an electric charge;
a second photoelectric converter that converts light from the second opening to an electric charge;

a first transfer device for transferring the electric charge converted by the first photoelectric converter;

a second transfer device for transferring the electric charge converted by the second photoelectric converter;

a first transfer control line connected to the first transfer device, a control signal for controlling the first transfer device being output on the first transfer control line; and a second transfer control line connected to the second transfer device, a control signal for controlling the second transfer device being output on the second transfer control line, wherein:

the first photoelectric converter is disposed between the first microlens and the second transfer control line in an optical axis direction of the first microlens; and the second photoelectric converter is disposed between the second microlens and the first transfer control line in an optical axis direction of the second microlens.

2. The image sensor according to claim 1, further comprising:

a first charge/voltage converter to which the electric charge converted by the first photoelectric converter is transferred by the first transfer device;

a second charge/voltage converter to which the electric charge converted by the second photoelectric converter is transferred by the second transfer device;

a first reset device for resetting a potential at the first charge/voltage converter;

a second reset device for resetting a potential at the second charge/voltage converter;

a first reset control line connected to the first reset device, a control signal for controlling the first reset device being output on the first reset control line; and a second reset control line connected to the second reset device, a control signal for controlling the second reset device being output on the second reset control line, wherein:

the first photoelectric converter is disposed between the first microlens and the second reset control line in the optical axis direction of the first microlens; and the second photoelectric converter is disposed between the second microlens and the first reset control line in the optical axis direction of the second microlens.

3. The image sensor according to claim 2, wherein:

the first transfer control line is disposed between the first photoelectric converter and the second reset control line in the optical axis direction of the first microlens; and the second transfer control line is disposed between the second photoelectric converter and the first reset control line the an optical axis direction of the second microlens.

4. The image sensor according to claim 3, further comprising:

a first source follower transistor that is connected to the first charge/voltage converter and outputs a first signal based upon the potential at the first charge/voltage converter;

a second source follower transistor that is connected to the second charge/voltage converter and outputs a second signal based upon the potential at the second charge/voltage converter;

a first output line to which the first signal is output;

a second output line to which the second signal is output;

a first select device for connecting the first source follower transistor and the first output line;

a second select device for connecting the second source follower transistor and the second output line;

a first select control line connected to the first select device, a control signal for controlling the first select device being output on the first select control line; and a second select control line connected to the second select device, a control signal for controlling the second select device being output on the second select control line, wherein:

the first photoelectric converter is disposed between the first microlens and the second select control line in the optical axis direction of the first microlens; and the second photoelectric converter is disposed between the second microlens and the first select control line in the optical axis direction of the second microlens.

5. The image sensor according to claim 4, wherein:

the first transfer control line is disposed between the first photoelectric converter and the second select control line in the optical axis direction of the first microlens; and the second transfer control line is disposed between the second photoelectric converter and the first select control line in the optical axis direction of the second microlens.

6. The image sensor according to claim 5, wherein:

the first output line is disposed between the first photoelectric converter and the second transfer control line in the optical axis direction of the first microlens; and the second output line is disposed between the second photoelectric converter and the first transfer control line in the optical axis direction of the second microlens.

7. The image sensor according to claim 5, wherein:

the first output line is disposed between the first photoelectric converter and the second reset control line in the optical axis direction of the first microlens; and the second output line is disposed between the second photoelectric converter and the first reset control line in the optical axis direction of the second microlens.

8. The image sensor according to claim 5, wherein:

the first output line is disposed between the first photoelectric converter and the second select control line in the optical axis direction of the first microlens; and the second output line is disposed between the second photoelectric converter and the first select control line in the optical axis direction of the second microlens.

9. The image sensor according to claim 1, further comprising:

a first charge/voltage converter to which the electric charge converted by the first photoelectric converter is transferred by the first transfer device;

a second charge/voltage converter to which the electric charge converted by the second photoelectric converter is transferred by the second transfer device;

a first source follower transistor that is connected to the first charge/voltage converter and outputs a first signal based upon the potential at the first charge/voltage converter;

a second source follower transistor that is connected to the second charge/voltage converter and outputs a second signal based upon the potential at the second charge/voltage converter;

a first output line to which the first signal is output;

a second output line to which the first signal is output;

a first select device for connecting the first source follower transistor and the first output line;

a second select device for connecting the second source follower transistor and the second output line;

a first select control line connected to the first select device, a control signal for controlling the first select device being output on the first select control line; and a second select control line connected to the second select device, a control signal for controlling the second select device being output on the second select control line, wherein:

the first photoelectric converter is disposed between the first microlens and the second select control line in the optical axis direction of the first microlens; and the second photoelectric converter is disposed between the second microlens and the first select control line in the optical axis direction of the second microlens.

10. The image sensor according to claim 9, wherein:

the first transfer control line is disposed between the first photoelectric converter and the second select control line in the optical axis direction of the first microlens; and the second transfer control line is disposed between the second photoelectric converter and the first select control line in the optical axis direction of the second microlens.

11. The image sensor according to claim 9, wherein:

the first output line is disposed between the first photoelectric converter and the second transfer control line in the optical axis direction of the first microlens; and the second output line is disposed between the second photoelectric converter and the first transfer control line in the optical axis direction of the second microlens.

12. The image sensor according to claim 9, wherein:

the first output line is disposed between the first photoelectric converter and the second select control line in the optical axis direction of the first microlens; and the second output line is disposed between the second photoelectric converter and the first select control line in the optical axis direction of the second microlens.

13. An image capturing device comprising:

the image sensor according to claim 1; and a controller that controls driving of a lens using a second signal output from the image sensor.

14. An image capturing device comprising:

the image sensor according to claim 1; and a controller that causes an image generated using a first signal output from the image sensor to be displayed on a display device.

15. An image capturing device comprising:

the image sensor according to claim 1; and a controller that causes data of an image generated using a first signal output from the image sensor to be recorded on a recording medium.

* * * * *